(12) United States Patent
Levy

(10) Patent No.: US 10,351,954 B2
(45) Date of Patent: Jul. 16, 2019

(54) DEPOSITION SYSTEM AND METHOD USING A DELIVERY HEAD SEPARATED FROM A SUBSTRATE BY GAS PRESSURE

(71) Applicant: Eastman Kodak Company, Rochester, NY (US)

(72) Inventor: David H. Levy, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 15/291,116

(22) Filed: Oct. 12, 2016

(65) Prior Publication Data

US 2017/0029949 A1 Feb. 2, 2017

Related U.S. Application Data

(62) Division of application No. 11/620,744, filed on Jan. 8, 2007.

(51) Int. Cl.
*C23C 16/455* (2006.01)
*C23C 16/40* (2006.01)
(Continued)

(52) U.S. Cl.
CPC ...... *C23C 16/45563* (2013.01); *C23C 16/403* (2013.01); *C23C 16/4408* (2013.01); *C23C 16/45519* (2013.01); *C23C 16/45525* (2013.01); *C23C 16/45527* (2013.01); *C23C 16/45551* (2013.01); *C23C 16/45553* (2013.01);
(Continued)

(58) Field of Classification Search
CPC .................................................. C23C 16/4408
See application file for complete search history.

(56) References Cited

U.S. PATENT DOCUMENTS 4,081,201 A 3/1978 Hassan et al.
4,226,526 A 10/1980 Spence-Bate
(Continued)

FOREIGN PATENT DOCUMENTS

GB 1268913 3/1972
JP 61-294812 12/1986
(Continued)

OTHER PUBLICATIONS

Viktor, Rainer, Opposition to EP3002346, Mar. 19, 2019 (Year: 2019).*

(Continued)

*Primary Examiner* — Joseph A Miller, Jr.
(74) *Attorney, Agent, or Firm* — David A. Novais

(57) ABSTRACT

A process for depositing a thin film material on a substrate is disclosed, comprising simultaneously directing a series of gas flows from the output face of a delivery head of a thin film deposition system toward the surface of a substrate, and wherein the series of gas flows comprises at least a first reactive gaseous material, an inert purge gas, and a second reactive gaseous material, wherein the first reactive gaseous material is capable of reacting with a substrate surface treated with the second reactive gaseous material, wherein one or more of the gas flows provides a pressure that at least contributes to the separation of the surface of the substrate from the face of the delivery head. A system capable of carrying out such a process is also disclosed.

22 Claims, 31 Drawing Sheets

(51) Int. Cl.
  *C23C 16/54* (2006.01)
  *C23C 16/44* (2006.01)
  *H01L 21/02* (2006.01)

(52) U.S. Cl.
  CPC ...... *C23C 16/45574* (2013.01); *C23C 16/545* (2013.01); *H01L 21/0228* (2013.01); *H01L 21/0262* (2013.01); *H01L 21/02164* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02192* (2013.01); *H01L 21/02557* (2013.01)

(56) References Cited

U.S. PATENT DOCUMENTS

| | | | |
|---|---|---|---|
| 4,413,022 | A | 11/1983 | Suntola et al. |
| 4,495,024 | A | 1/1985 | Bok |
| 4,574,093 | A | 3/1986 | Cox |
| 4,575,408 | A | 3/1986 | Bok |
| 4,587,002 | A | 5/1986 | Bok |
| 4,590,042 | A | 5/1986 | Drage |
| 4,622,918 | A | 11/1986 | Bok |
| 4,663,197 | A | 5/1987 | Bok |
| 4,738,748 | A | 4/1988 | Kisa |
| 4,801,352 | A | 1/1989 | Piwczyk |
| 4,987,856 | A | 1/1991 | Hey et al. |
| 5,122,391 | A | 6/1992 | Mayer |
| 5,134,963 | A | 8/1992 | Barbee et al. |
| 5,284,519 | A | 2/1994 | Gadgil |
| 5,445,699 | A | 8/1995 | Kamikawa et al. |
| 5,884,009 | A | 3/1999 | Okase |
| 5,958,140 | A | 9/1999 | Arami et al. |
| 6,183,565 | B1 | 2/2001 | Granneman et al. |
| 6,200,389 | B1 | 3/2001 | Miller et al. |
| 6,358,327 | B1* | 3/2002 | Pokharna ............ C23C 16/4405 134/1.1 |
| 6,721,035 | B1 | 4/2004 | Segers et al. |
| 6,793,733 | B2 | 9/2004 | Janakiraman et al. |
| 6,796,054 | B2 | 9/2004 | Minami et al. |
| 6,821,563 | B2 | 11/2004 | Yudovsky |
| 6,872,258 | B2 | 3/2005 | Park et al. |
| 6,888,172 | B2 | 5/2005 | Ghosh |
| 6,929,830 | B2 | 8/2005 | Tei et al. |
| 7,456,429 | B2 | 11/2008 | Levy et al. |
| 7,789,961 | B2 | 9/2010 | Nelson et al. |
| 2001/0024387 | A1* | 9/2001 | Raaijmakers ..... H01L 21/02159 365/200 |
| 2002/0043216 | A1 | 4/2002 | Hwang et al. |
| 2003/0027431 | A1 | 2/2003 | Sneh et al. |
| 2003/0036272 | A1 | 2/2003 | Shamouilian et al. |
| 2003/0140851 | A1 | 7/2003 | Janakiraman et al. |
| 2004/0065255 | A1 | 4/2004 | Yang et al. |
| 2004/0067641 | A1 | 4/2004 | Yudovsky |
| 2004/0087168 | A1 | 5/2004 | Granneman et al. |
| 2004/0112537 | A1 | 6/2004 | Yamazaki et al. |
| 2004/0142558 | A1 | 7/2004 | Granneman |
| 2005/0084610 | A1 | 4/2005 | Selitser |
| 2005/0172897 | A1 | 8/2005 | Jansen |
| 2006/0000411 | A1 | 1/2006 | Seo et al. |
| 2006/0105678 | A1 | 5/2006 | Kohama et al. |
| 2006/0130759 | A1 | 6/2006 | Kido et al. |
| 2006/0214154 | A1 | 9/2006 | Yang et al. |
| 2007/0034228 | A1 | 2/2007 | Devitt |
| 2007/0076780 | A1 | 4/2007 | Champetier et al. |
| 2007/0224348 | A1 | 9/2007 | Dickey et al. |
| 2007/0256786 | A1 | 11/2007 | Zhou et al. |
| 2007/0281089 | A1 | 12/2007 | Heller et al. |
| 2009/0081886 | A1* | 3/2009 | Levy ................. C23C 16/45551 438/790 |
| 2009/0120501 | A1 | 5/2009 | Engle |

FOREIGN PATENT DOCUMENTS

| | | |
|---|---|---|
| JP | 62-021237 | 1/1987 |
| JP | 62-150711 | 7/1987 |
| JP | 04-078130 | 3/1992 |
| JP | 03-019318 | 12/1995 |
| JP | 2005-171272 | 6/2005 |
| JP | 2005-179705 | 7/2005 |
| JP | 2006-040936 | 2/2006 |
| JP | 2006-005316 | 1/2008 |

OTHER PUBLICATIONS

Poodt, P. et al., "Spatial Atomic Layer Deposition: A route towards further industrialization of atomic layer deposition", J, Va. Sci. Technol., A 30(1), Jan./Feb. 2012, pp. 010802-1-010802-11.

Levy et al., "Oxide Electronics by Spatial Atomic Layer Deposition", *Journal of Display Technology*, vol. 5, No. 12, Dec. 2009, pp. 484-494.

"Conduction Heating in RPT, Fast, and Pattern-Independent," by Ernst Granneman, published in Materials Science Forum, vols. 573-574, pp. 375-386.

Granneman Affidavit, Oct. 23, 2018; Communications of Notice of Opposition dated Nov. 6, 2018.

Textbook: Transport Phenomena Interphase Transport in Isothermal Systems; pp. 180-207; Communications of Notice of Opposition dated Jan. 25, 2017.

Aug. 9, 2016 EP 2122005 Notice of Opposition.

* cited by examiner

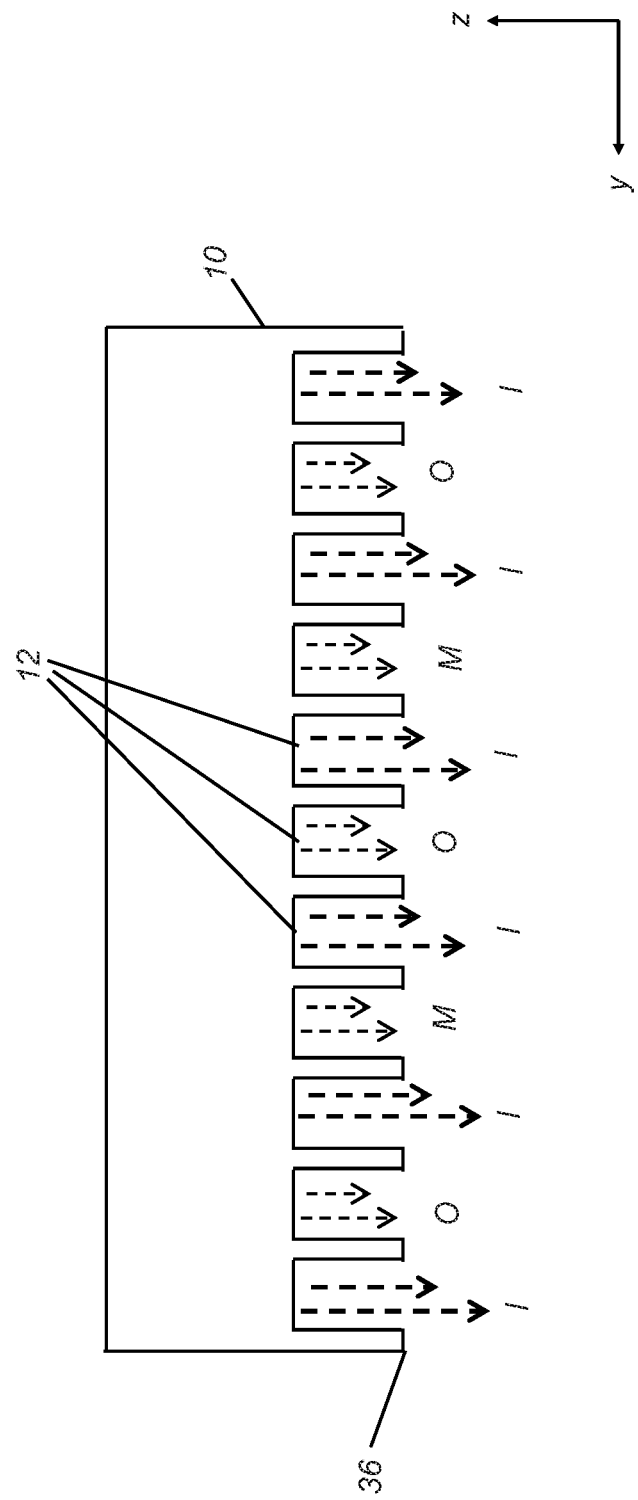

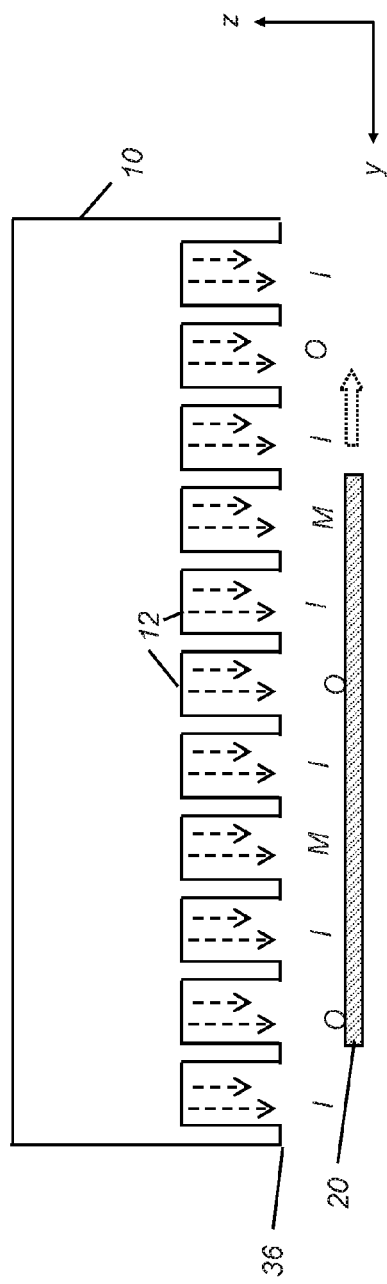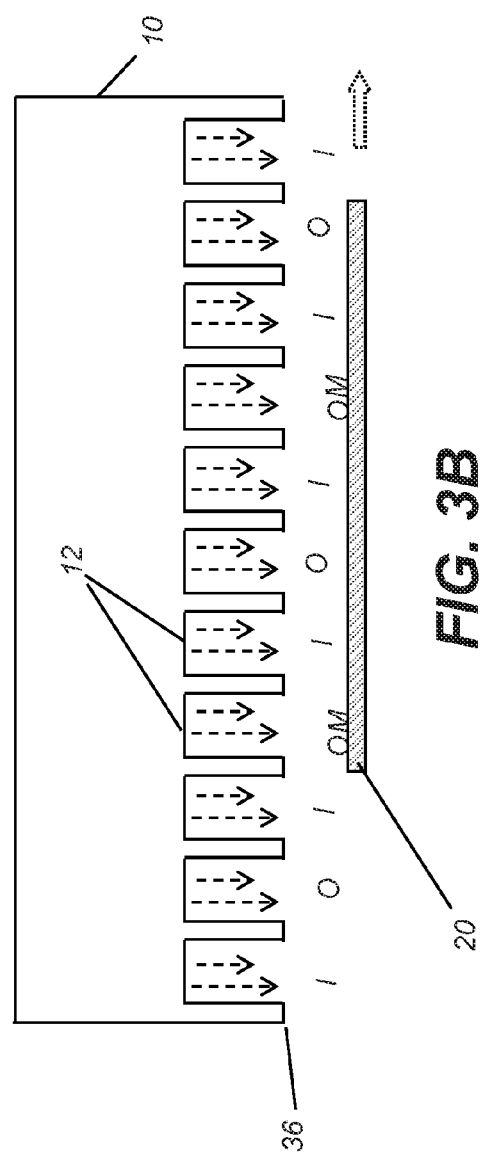

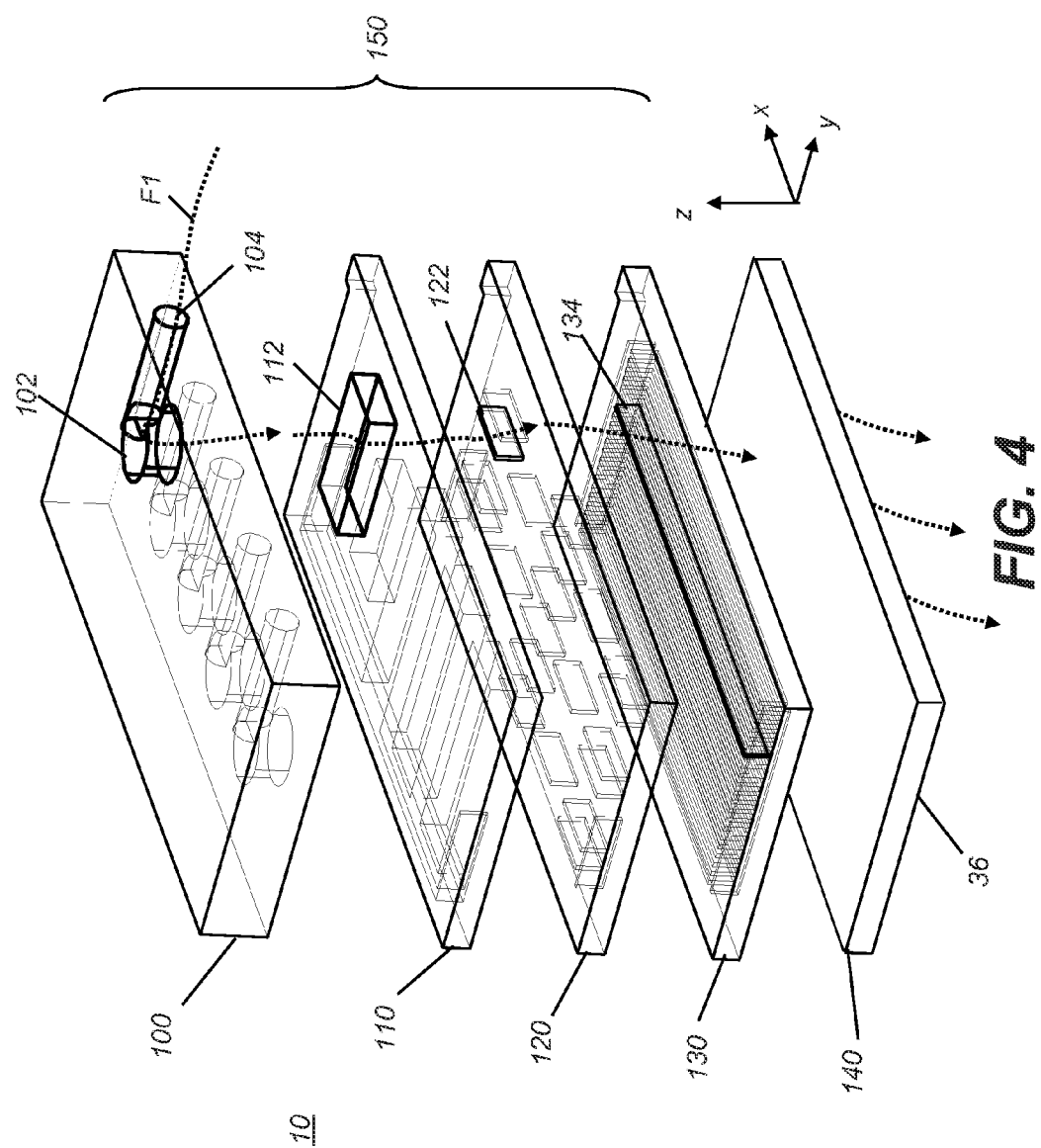

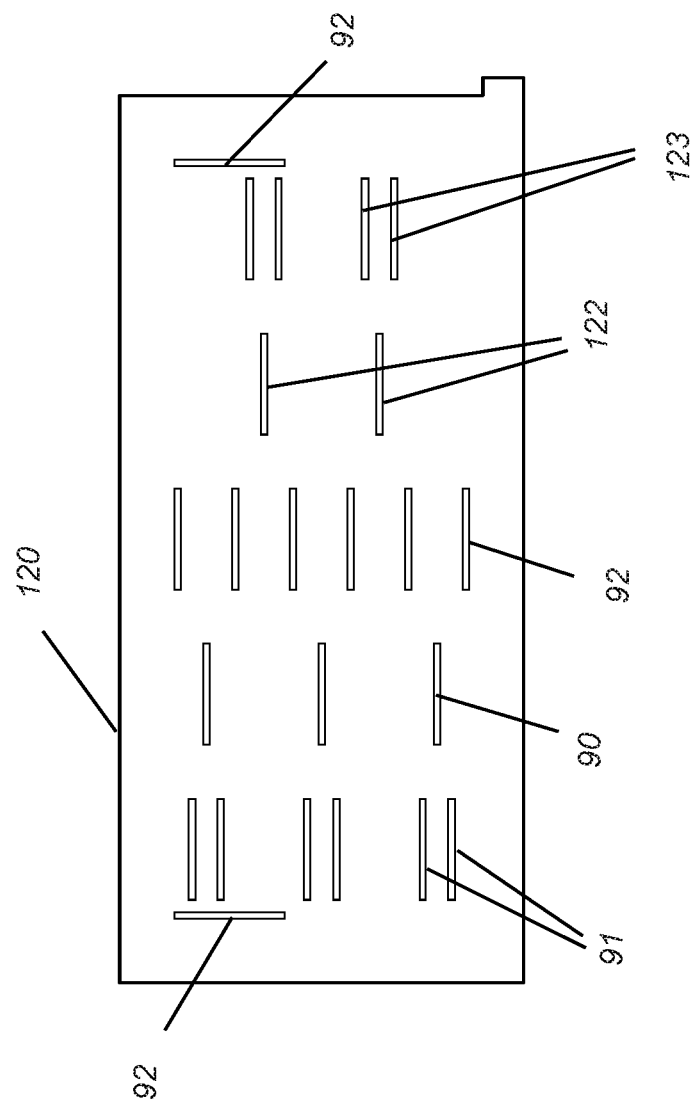

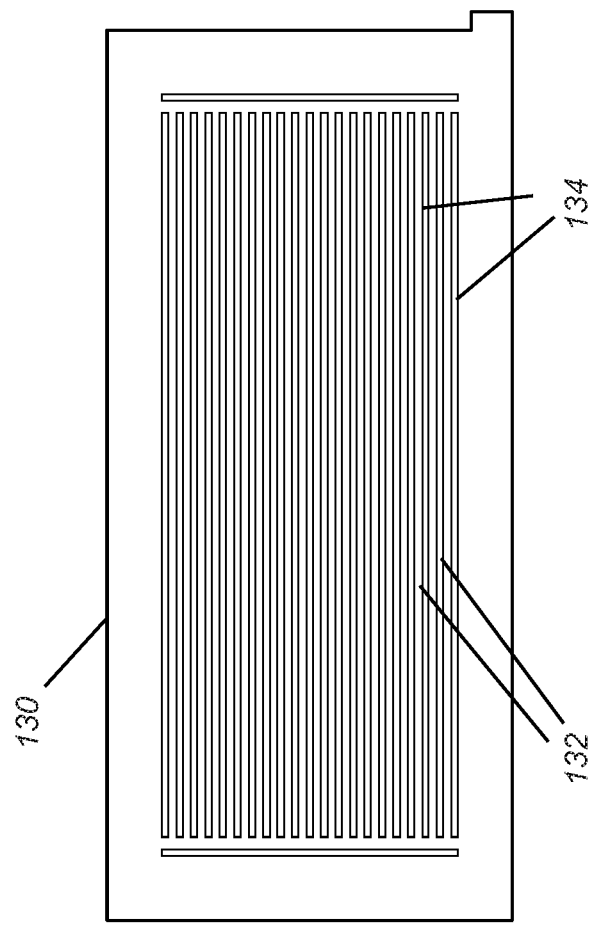

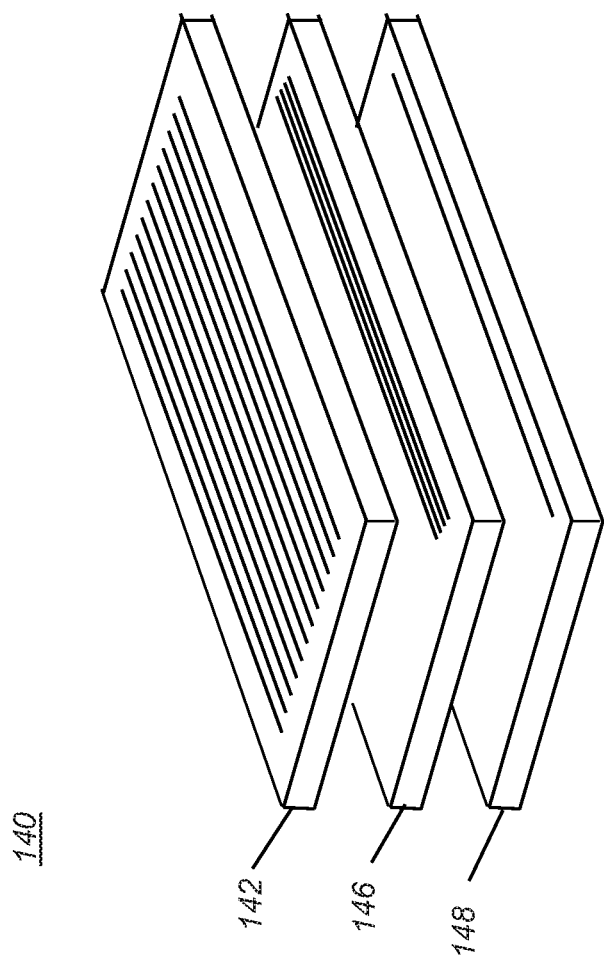

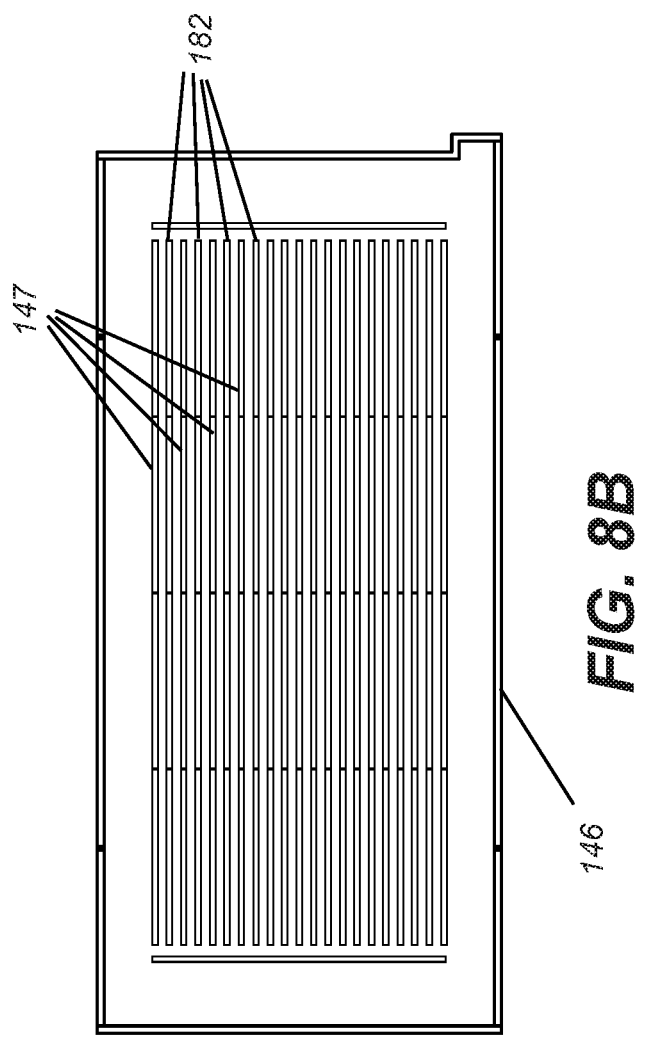

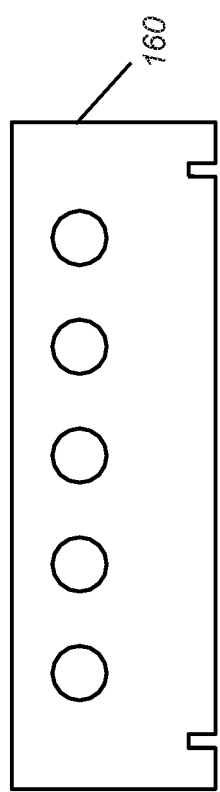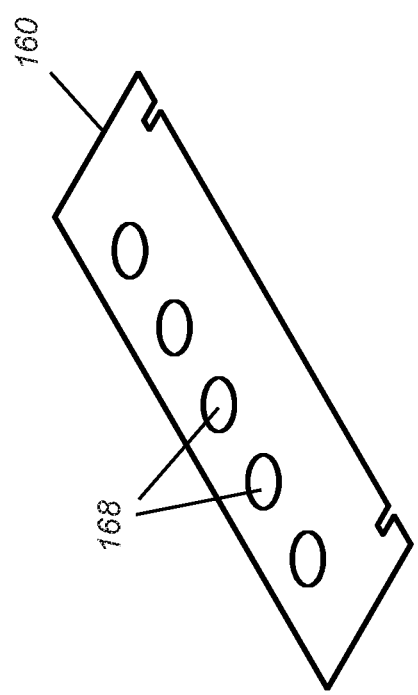

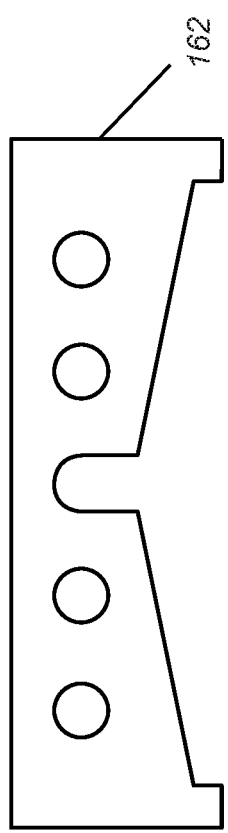
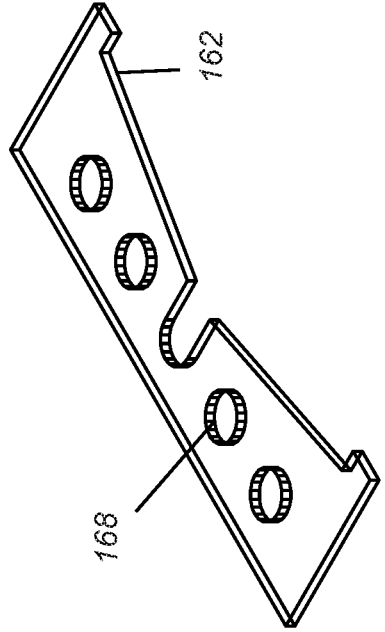
FIG. 11A
FIG. 11B

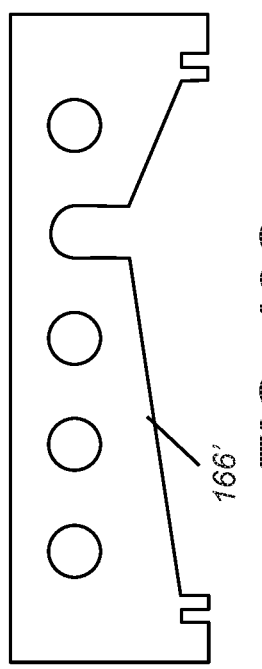

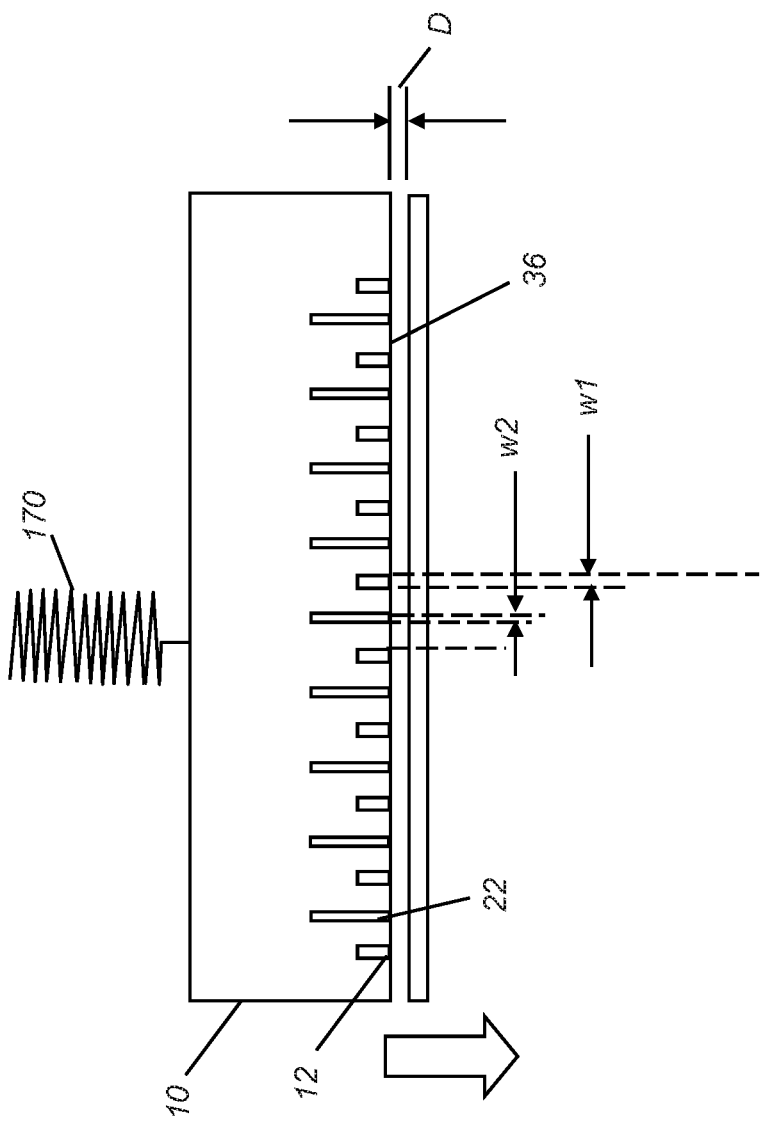

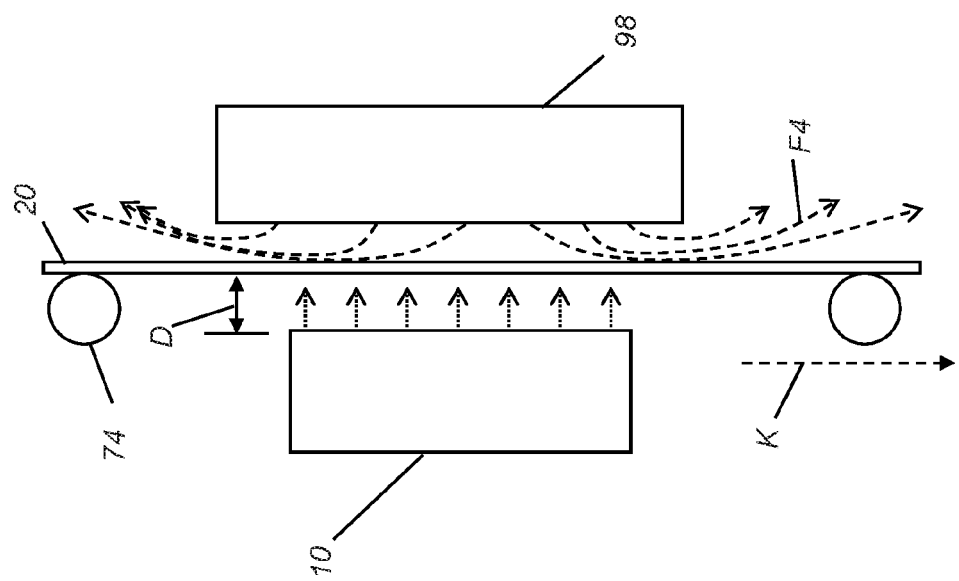

DEPOSITION SYSTEM AND METHOD USING A DELIVERY HEAD SEPARATED FROM A SUBSTRATE BY GAS PRESSURE

CROSS-REFERENCE TO RELATED APPLICATIONS

This application is a divisional of prior U.S. patent application Ser. No. 11/620,744, filed Jan. 8, 2007, which is hereby incorporated herein by reference in its entirety.

FIELD OF THE INVENTION

This invention generally relates to the deposition of thin-film materials and, more particularly, to apparatus for atomic layer deposition onto a substrate using a distribution head directing simultaneous gas flows onto a substrate.

BACKGROUND OF THE INVENTION

Among the techniques widely used for thin-film deposition is Chemical Vapor Deposition (CVD) that uses chemically reactive molecules that react in a reaction chamber to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Common to most CVD techniques is the need for application of a well-controlled flux of one or more molecular precursors into the CVD reactor. A substrate is kept at a well-controlled temperature under controlled pressure conditions to promote chemical reaction between these molecular precursors, concurrent with efficient removal of byproducts. Obtaining optimum CVD performance requires the ability to achieve and sustain steady-state conditions of gas flow, temperature, and pressure throughout the process, and the ability to minimize or eliminate transients.

Especially in the field of semiconductor, integrated circuit, and other electronic devices, there is a demand for thin films, especially higher quality, denser films, with superior conformal coating properties, beyond the achievable limits of conventional CVD techniques, especially thin films that can be manufactured at lower temperatures.

Atomic layer deposition ("ALD") is an alternative film deposition technology that can provide improved thickness resolution and conformal capabilities, compared to its CVD predecessor. The ALD process segments the conventional thin-film deposition process of conventional CVD into single atomic-layer deposition steps. Advantageously, ALD steps are self-terminating and can deposit one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the absence of the other precursor or precursors of the reaction. In practice, in any system it is difficult to avoid some direct reaction of the different precursors leading to a small amount of chemical vapor deposition reaction. The goal of any system claiming to perform ALD is to obtain device performance and attributes commensurate with an ALD system while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous metal precursor molecule effectively reacts with all of the ligands on the substrate surface, resulting in deposition of a single atomic layer of the metal:

$$\text{substrate-AH} + ML_x \rightarrow \text{substrate-AML}_{x-1} + HL \qquad (1)$$

where HL is a reaction by-product. During the reaction, the initial surface ligands, AH, are consumed, and the surface becomes covered with L ligands, which cannot further react with metal precursor $ML_x$. Therefore, the reaction self-terminates when all of the initial AH ligands on the surface are replaced with $AML_{x-1}$ species. The reaction stage is typically followed by an inert-gas purge stage that eliminates the excess metal precursor from the chamber prior to the separate introduction of a second reactant gaseous precursor material.

The second molecular precursor then is used to restore the surface reactivity of the substrate towards the metal precursor. This is done, for example, by removing the L ligands and redepositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

$$\text{substrate-A-ML} + AH_y \rightarrow \text{substrate-A-M-AH} + HL \qquad (2)$$

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, the basic ALD process requires alternating, in sequence, the flux of chemicals to the substrate. The representative ALD process, as discussed above, is a cycle having four different operational stages:
1. $ML_x$ reaction;
2. $ML_x$ purge;
3. $AH_y$ reaction; and
4. $AH_y$ purge, and then back to stage 1.

This repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all alike in chemical kinetics, deposition per cycle, composition, and thickness.

ALD can be used as a fabrication step for forming a number of types of thin-film electronic devices, including semiconductor devices and supporting electronic components such as resistors and capacitors, insulators, bus lines and other conductive structures. ALD is particularly suited for forming thin layers of metal oxides in the components of electronic devices. General classes of functional materials that can be deposited with ALD include conductors, dielectrics or insulators, and semiconductors.

Conductors can be any useful conductive material. For example, the conductors may comprise transparent materials such as indium-tin oxide (ITO), doped zinc oxide ZnO, $SnO_2$, or $In_2O_3$. The thickness of the conductor may vary, and according to particular examples it can range from about 50 to about 1000 nm.

Examples of useful semiconducting materials are compound semiconductors such as gallium arsenide, gallium nitride, cadmium sulfide, intrinsic zinc oxide, and zinc sulfide.

A dielectric material electrically insulates various portions of a patterned circuit. A dielectric layer may also be referred to as an insulator or insulating layer. Specific examples of materials useful as dielectrics include strontiates, tantalates, titanates, zirconates, aluminum oxides, silicon oxides, tantalum oxides, hafnium oxides, titanium oxides, zinc selenide, and zinc sulfide. In addition, alloys, combinations, and multilayers of these examples can be used as dielectrics. Of these materials, aluminum oxides are preferred.

A dielectric structure layer may comprise two or more layers having different dielectric constants. Such insulators are discussed in U.S. Pat. No. 5,981,970 hereby incorporated by reference and copending U.S. application Ser. No. 11/088,645, hereby incorporated by reference. Dielectric materials typically exhibit a band-gap of greater than about 5 eV. The thickness of a useful dielectric layer may vary, and according to particular examples it can range from about 10 to about 300 nm.

A number of device structures can be made with the functional layers described above. A resistor can be fabricated by selecting a conducting material with moderate to poor conductivity. A capacitor can be made by placing a dielectric between two conductors. A diode can be made by placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor may be made by placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the necessary interfaces are created.

In typical applications of a thin film transistor, the need is for a switch that can control the flow of current through the device. As such, it is desired that when the switch is turned on a high current can flow through the device. The extent of current flow is related to the semiconductor charge carrier mobility. When the device is turned off, it is desirable that the current flow be very small. This is related to the charge carrier concentration. Furthermore, it is generally preferable that visible light have little or no influence on thin-film transistor response. In order for this to be true, the semiconductor band gap must be sufficiently large (>3 eV) so that exposure to visible light does not cause an inter-band transition. A material that is capable of yielding a high mobility, low carrier concentration, and high band gap is ZnO. Furthermore, for high-volume manufacture onto a moving web, it is highly desirable that chemistries used in the process be both inexpensive and of low toxicity, which can be satisfied by the use of ZnO and the majority of its precursors.

Self-saturating surface reactions make ALD relatively insensitive to transport non-uniformities, which might otherwise impair surface uniformity, due to engineering tolerances and the limitations of the flow system or related to surface topography (that is, deposition into three dimensional, high aspect ratio structures). As a general rule, a non-uniform flux of chemicals in a reactive process generally results in different completion times over different portions of the surface area. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the full treated surface undergoes the intended reaction.

Typically, an ALD process deposits about 0.1-0.2 nm of a film in a single ALD cycle (with one cycle having numbered steps 1 through 4 as listed earlier). A useful and economically feasible cycle time must be achieved in order to provide a uniform film thickness in a range of about from 3 nm to 30 nm for many or most semiconductor applications, and even thicker films for other applications. According to industry throughput standards, substrates are preferably processed within 2 minutes to 3 minutes, which means that ALD cycle times must be in a range from about 0.6 seconds to about 6 seconds.

ALD offers considerable promise for providing a controlled level of highly uniform thin film deposition. However, in spite of its inherent technical capabilities and advantages, a number of technical hurdles still remain. One important consideration relates to the number of cycles needed. Because of its repeated reactant and purge cycles, effective use of ALD has required an apparatus that is capable of abruptly changing the flux of chemicals from $ML_x$ to $AH_y$, along with quickly performing purge cycles. Conventional ALD systems are designed to rapidly cycle the different gaseous substances onto the substrate in the needed sequence. However, it is difficult to obtain a reliable scheme for introducing the needed series of gaseous formulations into a chamber at the needed speeds and without some unwanted mixing. Furthermore, an ALD apparatus must be able to execute this rapid sequencing efficiently and reliably for many cycles in order to allow cost-effective coating of many substrates.

In an effort to minimize the time that an ALD reaction needs to reach self-termination, at any given reaction temperature, one approach has been to maximize the flux of chemicals flowing into the ALD reactor, using so-called "pulsing" systems. In order to maximize the flux of chemicals into the ALD reactor, it is advantageous to introduce the molecular precursors into the ALD reactor with minimum dilution of inert gas and at high pressures. However, these measures work against the need to achieve short cycle times and the rapid removal of these molecular precursors from the ALD reactor. Rapid removal in turn dictates that gas residence time in the ALD reactor be minimized. Gas residence times, τ, are proportional to the volume of the reactor, V, the pressure, P, in the ALD reactor, and the inverse of the flow, Q, that is:

$$\tau = VP/Q \tag{3}$$

In a typical ALD chamber the volume (V) and pressure (P) are dictated independently by the mechanical and pumping constraints, leading to difficulty in precisely controlling the residence time to low values. Accordingly, lowering pressure (P) in the ALD reactor facilitates low gas residence times and increases the speed of removal (purge) of chemical precursor from the ALD reactor. In contrast, minimizing the ALD reaction time requires maximizing the flux of chemical precursors into the ALD reactor through the use of a high pressure within the ALD reactor. In addition, both gas residence time and chemical usage efficiency are inversely proportional to the flow. Thus, while lowering flow can increase efficiency, it also increases gas residence time.

Existing ALD approaches have been compromised with the trade-off between the need to shorten reaction times with improved chemical utilization efficiency, and, on the other hand, the need to minimize purge-gas residence and chemical removal times. One approach to overcome the inherent limitations of "pulsed" delivery of gaseous material is to provide each reactant gas continuously and to move the substrate through each gas in succession. For example, U.S. Pat. No. 6,821,563 entitled "GAS DISTRIBUTION SYSTEM FOR CYCLICAL LAYER DEPOSITION" to Yudovsky describes a processing chamber, under vacuum, having separate gas ports for precursor and purge gases, alternating with vacuum pump ports between each gas port. Each gas port directs its stream of gas vertically downward toward a substrate. The separate gas flows are separated by walls or partitions, with vacuum pumps for evacuating gas on both sides of each gas stream. A lower portion of each partition extends close to the substrate, for example, about 0.5 mm or greater from the substrate surface. In this manner, the lower portions of the partitions are separated from the substrate surface by a distance sufficient to allow the gas streams to flow around the lower portions toward the vacuum ports after the gas streams react with the substrate surface.

A rotary turntable or other transport device is provided for holding one or more substrate wafers. With this arrangement, the substrate is shuttled beneath the different gas streams, effecting ALD deposition thereby. In one embodiment, the substrate is moved in a linear path through a chamber, in which the substrate is passed back and forth a number of times.

Another approach using continuous gas flow is shown in U.S. Pat. No. 4,413,022 entitled "METHOD FOR PERFORMING GROWTH OF COMPOUND THIN FILMS" to Suntola et al. A gas flow array is provided with alternating source gas openings, carrier gas openings, and vacuum exhaust openings. Reciprocating motion of the substrate over the array effects ALD deposition, again, without the need for pulsed operation. In the embodiment of FIGS. 13 and 14, in particular, sequential interactions between a substrate surface and reactive vapors are made by a reciprocating motion of the substrate over a fixed array of source openings. Diffusion barriers are formed by having a carrier gas opening between exhaust openings. Suntola et al. state that operation with such an embodiment is possible even at atmospheric pressure, although little or no details of the process, or examples, are provided.

While systems such as those described in the '563 Yudovsky and '022 Suntola et al. disclosures may avoid some of the difficulties inherent to pulsed gas approaches, these systems have other drawbacks. Neither the gas flow delivery unit of the '563 Yudovsky disclosure nor the gas flow array of the '022 Suntola et al. disclosure can be used in closer proximity to the substrate than about 0.5 mm. Neither of the gas flow delivery apparatus disclosed in the '563 Yudovsky and '022 Suntola et al. patents are arranged for possible use with a moving web surface, such as could be used as a flexible substrate for forming electronic circuits, light sensors, or displays, for example. The complex arrangements of both the gas flow delivery unit of the '563 Yudovsky disclosure and the gas flow array of the '022 Suntola et al. disclosure, each providing both gas flow and vacuum, make these solutions difficult to implement and costly to scale and limit their potential usability to deposition applications onto a moving substrate of limited dimensions. Moreover, it would be very difficult to maintain a uniform vacuum at different points in an array and to maintain synchronous gas flow and vacuum at complementary pressures, thus compromising the uniformity of gas flux that is provided to the substrate surface.

U.S. Patent Pub. No. 2005/0084610 to Selitser discloses an atmospheric pressure atomic layer chemical vapor deposition process. Selitser et al. state that extraordinary increases in reaction rates are obtained by changing the operating pressure to atmospheric pressure, which will involve orders of magnitude increase in the concentration of reactants, with consequent enhancement of surface reactant rates. The embodiments of Selitser et al. involve separate chambers for each stage of the process, although FIG. 10 in Selitser '4610 shows an embodiment in which chamber walls are removed. A series of separated injectors are spaced around a rotating circular substrate holder track. Each injector incorporates independently operated reactant, purging, and exhaust gas manifolds and controls and acts as one complete mono-layer deposition and reactant purge cycle for each substrate as is passes there under in the process. Little or no specific details of the gas injectors or manifolds are described by Selitser et al., although they state that spacing of the injectors is selected so that cross-contamination from adjacent injectors is prevented by purging gas flows and exhaust manifolds incorporate in each injector.

One aspect of ALD processing that has been of special interest relates to temperature control of the silicon wafer substrate. Among the solutions proposed for accurate temperature control during materials deposition are those described in U.S. Patent Application Publication No. 2004/0142558 by Granneman. In the Granneman '2558 disclosure, platens positioned above and below the wafer act as both gas sources and heating components. In pulsed deposition embodiments described in U.S. Pat. No. 6,183,565 entitled "METHOD AND APPARATUS FOR SUPPORTING A SEMICONDUCTOR WAFER DURING PROCESSING" to Granneman et al., the semiconductor wafer substrate is supported by heated gas streams during deposition, thus providing control of temperature using conductive heating, rather than radiated heat transfer, during this process. Similarly, for CVD applications, Japanese Publication Nos. 62-021237 entitled "TABLE FOR WAFER POSITIONING" to Sugimoto, 04-078130 entitled "SEMICONDUCTOR VAPOR GROWTH EQUIPMENT" to Hashimoto et al., and 61-294812 entitled "GAS PHASE FLOATING EPITAXIAL GROWTH" to Tokisue et al. describe "levitation" of a semiconductor wafer by streams of gas jets during deposition processing. It has thus been recognized that heating and transport of the semiconductor wafer during chemical deposition can be effected using gas jets. At least one commercial product used in semiconductor fabrication, the LEVITOR RTP (Rapid Thermal Processing) Reactor manufactured by ASM International N.V., Bilthoven, Netherlands, employs this "gas fluid bearing" method for its thermal transfer and wafer-handling advantages. However, this and similar devices do not provide spatial separation of gases from each other during deposition, but are based on the pulsed delivery model described earlier in this background material.

It can be appreciated that the use of air-bearing principles or, more generally, gas fluid-bearing principles, can yield a number of advantages for improved wafer transport during vapor deposition and ALD processes. However, existing solutions have been directed to pulsed deposition systems, necessitating the design of fairly complex mechanical and gas-routing systems and components. Air-bearing levitation of the wafer in such systems requires that a chamber be provided, having a base block on one side of the wafer that continuously provides an inert gas for levitating the wafer and a deposition block on the other side of the wafer for providing the repeated, rapid sequencing of reactant and purge gas cycles necessary for efficient materials deposition. Thus, it can be seen that there is a need for ALD deposition method and apparatus that can be used with a continuous process and that can provide improved gas mobility and gas flow separation over earlier solutions.

SUMMARY OF THE INVENTION

The present invention provides a process for depositing a thin film material on a substrate, comprising simultaneously directing a series of gas flows from the output face of a delivery head of a thin film deposition system toward the surface of a substrate, wherein the series of gas flows comprises at least a first reactive gaseous material, an inert purge gas, and a second reactive gaseous material. The first reactive gaseous material is capable of reacting with a substrate surface treated with the second reactive gaseous material. One or more of the gas flows provides a pressure that at least contributes to the separation of the surface of the substrate from the face of the delivery head.

Another aspect of the present invention provides a deposition system for thin film deposition of a solid material onto a substrate comprising:
  a) a plurality of sources for, respectively, a plurality of gaseous materials comprising at least a first, a second, and a third source for a first, a second, and a third gaseous material, respectively;
  b) a delivery head for delivering the gaseous materials to a substrate receiving thin film deposition and comprising:
    (i) a plurality of inlet ports comprising at least a first, a second, and a third inlet port for receiving the first, the second, and the third gaseous material, respectively; and
    (ii) an output face comprising a plurality of output openings and facing the substrate a distance from the surface of the substrate, wherein the first, second, and third gaseous materials are simultaneously exhausted from the output openings in the output face;
  c) an optional substrate support for supporting the substrate; and
  d) maintaining a substantially uniform distance between the output face of the delivery head and the substrate surface during thin film deposition, wherein pressure generated due to flow of one or more of the gaseous materials from the delivery head to the substrate surface for thin film deposition provides at least part of the force separating the output face of the delivery head from the surface of the substrate.

In one embodiment, the system provides a relative oscillating motion between the distribution head and the substrate. In a preferred embodiment, the system can be operated with continuous movement of a substrate being subjected to thin film deposition, wherein the system is capable of conveying the support on or as a web past the distribution head, preferably in an unsealed environment to ambient at substantially atmospheric pressure.

It is an advantage of the present invention that it can provide a compact apparatus for atomic layer deposition onto a substrate that is well suited to a number of different types of substrates and deposition environments.

It is a further advantage of the present invention that it allows operation, in preferred embodiments, under atmospheric pressure conditions.

It is yet a further advantage of the present invention that it is adaptable for deposition on a web or other moving substrate, including deposition onto a large area substrate.

It is still a further advantage of the present invention that it can be employed in low temperature processes at atmospheric pressures, which process may be practiced in an unsealed environment, open to ambient atmosphere. The method of the present invention allows control of the gas residence time τ in the relationship shown earlier in equation (3), allowing residence time τ to be reduced, with system pressure and volume controlled by a single variable, the gas flow.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIG. 2 is a cross-sectional side view of one embodiment of a delivery head showing one exemplary arrangement of gaseous materials provided to a substrate that is subject to thin film deposition;

FIGS. 3A and 3B are cross-sectional side views of one embodiment of a delivery head, schematically showing the accompanying deposition operation;

FIG. 4 is a perspective exploded view of a delivery head in a deposition system according to one embodiment;

FIG. 5C is a plan view of a gas direction plate for the delivery head of FIG. 4;

FIG. 5D is a plan view of a base plate for the delivery head of FIG. 4;

FIG. 7 is an exploded view of a gas diffuser unit according to one embodiment;

FIG. 8B is a plan view of a gas diffuser plate of the gas diffuser unit of FIG. 7;

FIGS. 10A and 10B are plan and perspective views, respectively, of a separator plate used in the vertical plate embodiment of FIG. 9A;

FIGS. 11A and 11B are plan and perspective views, respectively, of a purge plate used in the vertical plate embodiment of FIG. 9A;

FIG. 13C is a plan view of a reactant plate in an alternate orientation;

FIG. 14 is a side view of a delivery head showing relevant distance dimensions and force directions;

FIG. 21 is a side view showing an embodiment for a deposition system comprising a gas fluid bearing for use with a moving substrate.

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

For the description that follows, superposition has its conventional meaning, wherein elements are laid atop or against one another in such manner that parts of one element align with corresponding parts of another and that their perimeters generally coincide.

Terms "upstream" and "downstream" have their conventional meanings as relates to the direction of gas flow.

The apparatus of the present invention offers a significant departure from conventional approaches to ALD, employing an improved distribution device for delivery of gaseous materials to a substrate surface, adaptable to deposition on larger and web-based or web-supported substrates and capable of achieving a highly uniform thin-film deposition at improved throughput speeds. The apparatus and method of the present invention employs a continuous (as opposed to pulsed) gaseous material distribution. The apparatus of the present invention allows operation at atmospheric or near-atmospheric pressures as well as under vacuum and is capable of operating in an unsealed or open-air environment.

Figure 1:
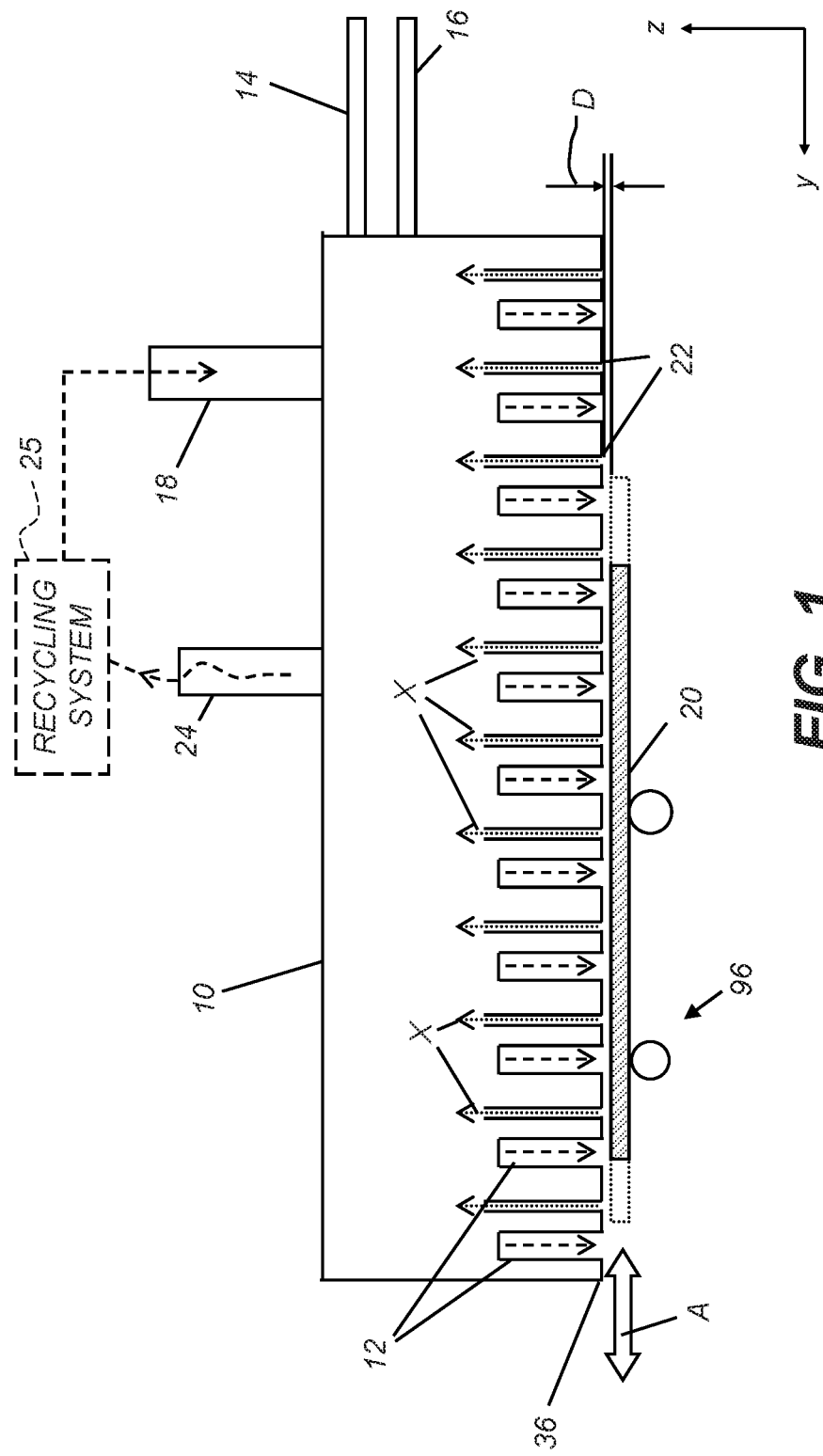
FIG. 1 is a cross-sectional side view of one embodiment of a delivery head for atomic layer deposition according to the present invention.

Referring to FIG. 1, there is shown a cross-sectional side view of one embodiment of a delivery head 10 for atomic layer deposition onto a substrate 20 according to the present invention. Delivery head 10 has a gas inlet conduit 14 that serves as an inlet port for accepting a first gaseous material, a gas inlet conduit 16 for an inlet port that accepts a second gaseous material, and a gas inlet conduit 18 for an inlet port that accepts a third gaseous material. These gases are emitted at an output face 36 via output channels 12, having a structural arrangement that may include a diffuser, as described subsequently. The dashed line arrows in FIG. 1 and subsequent FIGS. 2-3B refer to the delivery of gases to substrate 20 from delivery head 10. In FIG. 1, dotted line arrows X also indicate paths for gas exhaust (shown directed upwards in this figure) and exhaust channels 22, in communication with an exhaust conduit 24 that provides an exhaust port. For simplicity of description, gas exhaust is not indicated in FIGS. 2-3B. Because the exhaust gases still may contain quantities of unreacted precursors, it may be undesirable to allow an exhaust flow predominantly containing one reactive species to mix with one predominantly containing another species. As such, it is recognized that the delivery head 10 may contain several independent exhaust ports. The exhaust port(s) can be connected in fluid communication to a recycling system 25 so that the gaseous material can be recycled for reuse.

In one embodiment, gas inlet conduits 14 and 16 are adapted to accept first and second gases that react sequentially on the substrate surface to effect ALD deposition, and gas inlet conduit 18 receives a purge gas that is inert with respect to the first and second gases. Delivery head 10 is spaced a distance D from substrate 20, which may be provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 1, substrate 20 is moved by a substrate support 96 across output face 36 in reciprocating fashion, as indicated by the arrow A and by phantom outlines to the right and left of substrate 20 in FIG. 1. It should be noted that reciprocating motion is not always required for thin-film deposition using delivery head 10.

Other types of relative motion between substrate 20 and delivery head 10 could also be provided, such as movement of either substrate 20 or delivery head 10 in one or more directions, as described in more detail subsequently.

The cross-sectional view of FIG. 2 shows gas flows emitted over a portion of output face 36 of delivery head 10 (with the exhaust path omitted as noted earlier). In this particular arrangement, each output channel 12 is in gaseous flow communication with one of gas inlet conduits 14, 16 or 18 seen in FIG. 1. Each output channel 12 delivers typically a first reactant gaseous material O, or a second reactant gaseous material M, or a third inert gaseous material I.

FIG. 2 shows a relatively basic or simple arrangement of gases. It is envisioned that a plurality of non-metal deposition precursors (like material O) or a plurality of metal-containing precursor materials (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. Significantly, an inter-stream labeled I for an inert gas, also termed a purge gas, separates any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 2 and following suggests some typical types of reactant gases. For example, first reactant gaseous material O could be an oxidizing gaseous material; second reactant gaseous material M would be a metal-containing compound, such as a material containing zinc. Inert gaseous material I could be nitrogen, argon, helium, or other gases commonly used as purge gases in ALD systems. Inert gaseous material I is inert with respect to first or second reactant gaseous materials O and M. Reaction between first and second reactant gaseous materials would form a metal oxide or other binary compound, such as zinc oxide ZnO or ZnS, used in semiconductors, in one embodiment. Reactions between more than two reactant gaseous materials could form a ternary compound, for example, ZnAlO.

The cross-sectional views of FIGS. 3A and 3B show, in simplified schematic form, the ALD coating operation performed as substrate 20 passes along output face 36 of delivery head 10 when delivering reactant gaseous materials O and M. In FIG. 3A, the surface of substrate 20 first receives an oxidizing material continuously emitted from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials. Unlike conventional solutions, the deposition sequence shown in FIGS. 3A and 3B is continuous during deposition for a given substrate or specified area thereof, rather than pulsed. That is, materials O and M are continuously emitted as substrate 20 passes across the surface of delivery head 10 or, conversely, as delivery head 10 passes along the surface of substrate 20.

As FIGS. 3A and 3B show, inert gaseous material I is provided in alternate output channels 12, between the flows of first and second reactant gaseous materials O and M. Notably, as was shown in FIG. 1, there are exhaust channels 22, but preferably no vacuum channels interspersed between the output channels 12. Only exhaust channels 22, providing a small amount of draw, are needed to vent spent gases emitted from delivery head 10 and used in processing.

One aspect of operation for delivery head 10 relates to its providing gas pressure against substrate 20, such that separation distance D is maintained, at least in part, by the force of pressure that is exerted. By maintaining some amount of gas pressure between output face 36 and the surface of substrate 20, the apparatus of the present invention provides at least some portion of an air bearing, or more properly a gas fluid bearing, for delivery head 10 itself or, alternately, for substrate 20. This arrangement helps to simplify the transport requirements for delivery head 10, as described subsequently. Importantly, the effect of allowing the delivery head to approach the substrate such that it is supported by gas pressure, helps to provide isolation between the gas streams. By allowing the head to float on these streams, pressure fields are set up in the reactive and purge flow areas that cause the gases to be directed from inlet to exhaust with little or no intermixing of other gas streams.

In one embodiment, since the separation distance D is relatively small, even a small change in distance D (for example, even 100 micrometers) would require a significant change in flow rates and consequently gas pressure providing the separation distance D. For example, in one embodiment, doubling the separation distance D, involving a change less than 1 mm, would necessitate more than doubling, preferably more than quadrupling, the flow rate of the gases providing the separation distance D. As a general principle, it is considered more advantageous in practice to minimize separation distance D and, consequently, to operate at reduced flow rates.

The exploded view of FIG. 4 shows, for a small portion of the overall assembly in one embodiment, how delivery head 10 can be constructed from a set of apertured plates and shows an exemplary gas flow path for just one portion of one of the gases. A connection plate 100 for the delivery head 10 has a series of input ports 104 for connection to gas supplies that are upstream of delivery head 10 and not shown in FIG. 4. Each input port 104 is in communication with a directing chamber 102 that directs the received gas downstream to a gas chamber plate 110. Gas chamber plate 110 has a supply chamber 112 that is in gas flow communication with an individual directing channel 122 on a gas direction plate 120. From directing channel 122, the gas flow proceeds to a particular elongated exhaust channel 134 on a base plate 130. A gas diffuser unit 140 provides diffusion and final delivery of the input gas at its output face 36. An exemplary gas flow F1 is traced through each of the component assemblies of delivery head 10. The x-y-z axis orientation shown in FIG. 4 also applies for FIGS. 5A and 7 in the present application.

As shown in the example of FIG. 4, delivery assembly 150 of delivery head 10 is formed as an arrangement of superposed apertured plates: connection plate 100, gas chamber plate 110, gas direction plate 120, and base plate 130. These plates are disposed substantially in parallel to output face 36 in this "horizontal" embodiment. Gas diffuser unit 140 can also be formed from superposed apertured plates, as is described subsequently. It can be appreciated that any of the plates shown in FIG. 4 could itself be fabrication from a stack of superposed plates. For example, it may be advantageous to form connection plate 100 from four or five stacked apertured plates that are suitably coupled together. This type of arrangement can be less complex than machining or molding methods for forming directing chambers 102 and input ports 104.

Gas diffuser unit 140 can be used to equalize the flow through the output channel providing the gaseous materials to the substrate. Co-assigned U.S. Pat. No. 7,789,961 to Nelson et al., hereby incorporated by reference, discloses various diffuser systems that optionally can be employed. Alternatively, the output channel can be used to provide the gaseous materials without a diffuser, as in U.S. Pat. No. 4,413,022 to Suntola et al., hereby incorporated by reference. By providing undiffused flows, higher throughputs may be obtained, possibly at the expense of less homogenous deposition. On the other hand, a diffuser system is especially advantageous for a floating head system described above, since it can provide a back pressure within the delivery device that facilitates the floating of the head.

Figure 5A:
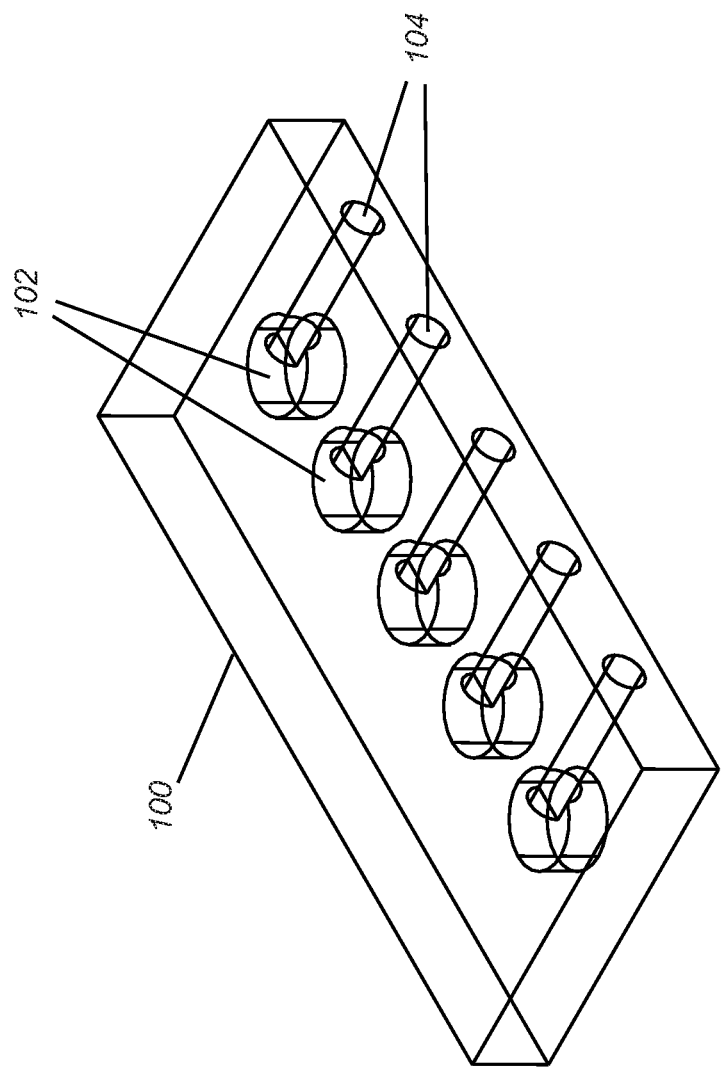
FIG. 5A is a perspective view of a connection plate for the delivery head of FIG. 4.
Figure 5B:
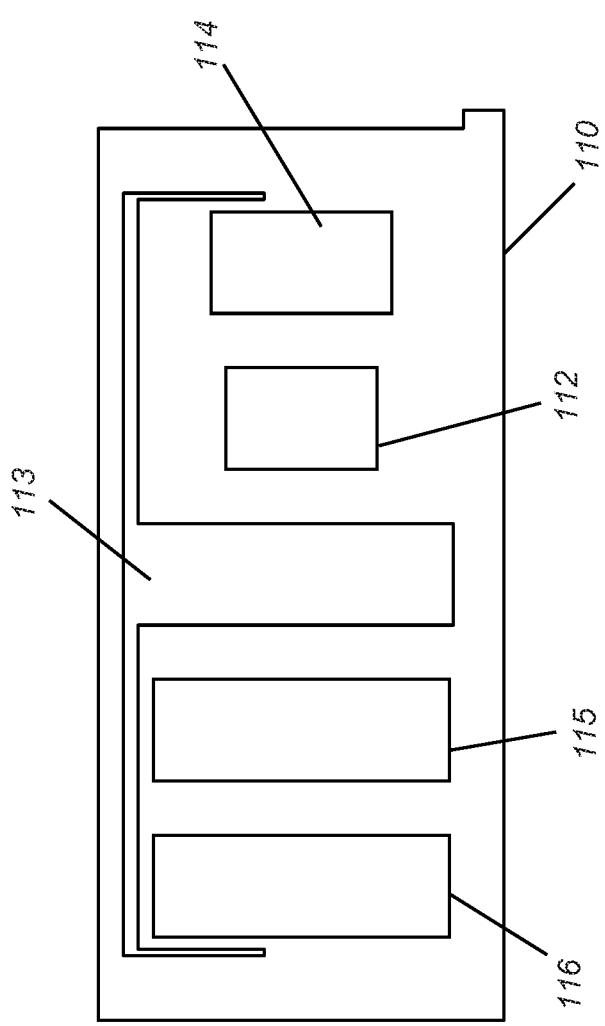
FIG. 5B is a plan view of a gas chamber plate for the delivery head of FIG. 4.

FIGS. 5A through 5D show each of the major components that are combined together to form delivery head 10 in the embodiment of FIG. 4. FIG. 5A is a perspective view of connection plate 100, showing multiple directing chambers 102. FIG. 5B is a plan view of gas chamber plate 110. A supply chamber 113 is used for purge or inert gas for delivery head 10 in one embodiment. A supply chamber 115 provides mixing for a precursor gas (O) in one embodiment; an exhaust chamber 116 provides an exhaust path for this reactive gas. Similarly, a supply chamber 112 provides the other needed reactive gas, metallic precursor gas (M); an exhaust chamber 114 provides an exhaust path for this gas.

FIG. 5C is a plan view of gas direction plate 120 for delivery head 10 in this embodiment. Multiple directing channels 122, providing a metallic precursor material (M), are arranged in a pattern for connecting the appropriate supply chamber 112 (not shown in this view) with base plate 130. Corresponding exhaust directing channels 123 are positioned near directing channels 122. Directing channels 90 provide the other precursor material (O) and have corresponding exhaust directing channels 91. Directing channels 92 provide purge gas (I). Again, it must be emphasized that FIGS. 4 and 5A-5D show one illustrative embodiment; numerous other embodiments are also possible.

FIG. 5D is a plan view of base plate 130 for delivery head 10. Base plate 130 has multiple elongated emissive channels 132 interleaved with exhaust channels 134.

Figure 6:
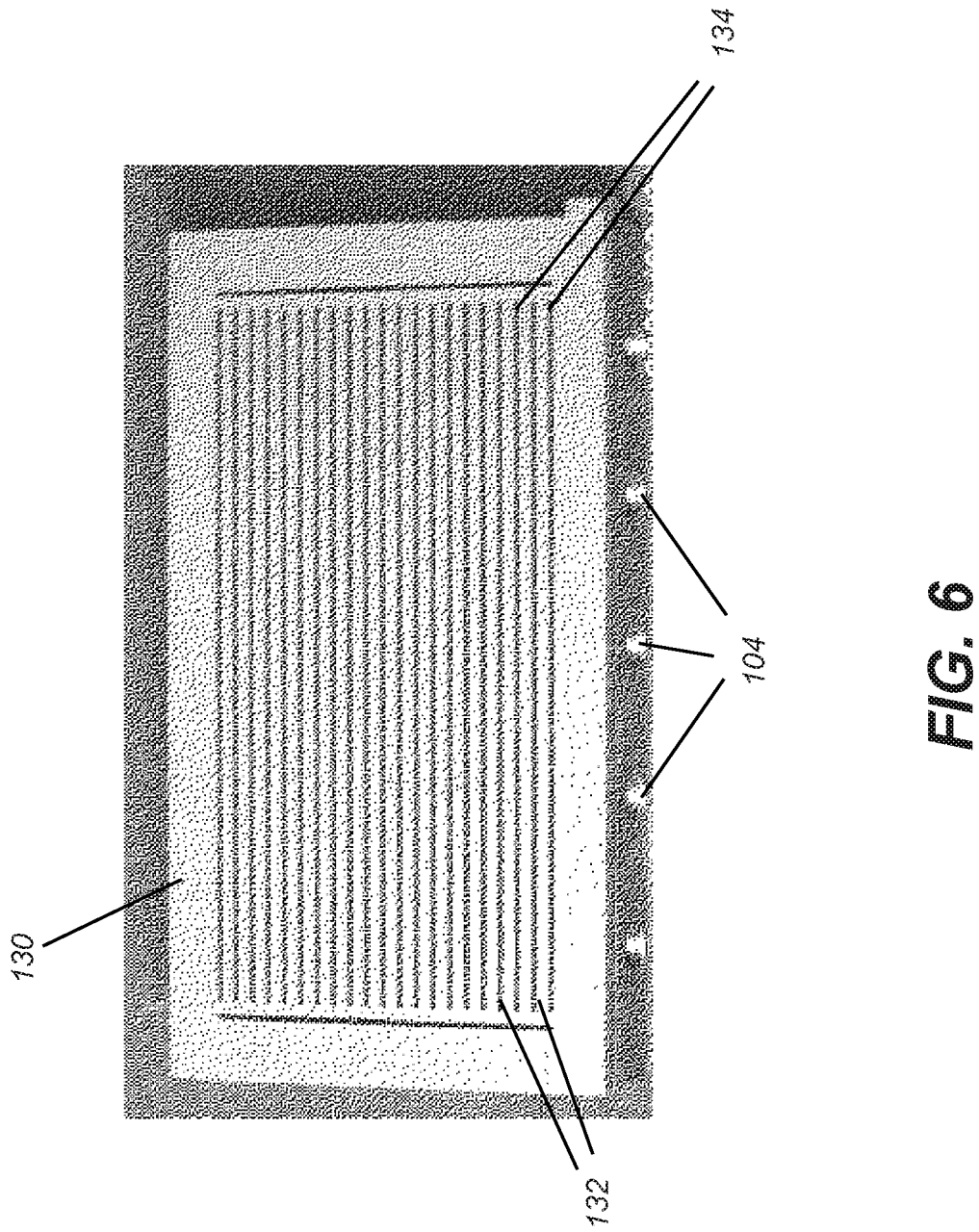
FIG. 6 is a perspective view showing a base plate on a delivery head in one embodiment.

FIG. 6 is a perspective view showing base plate 130 formed from horizontal plates and showing input ports 104. The perspective view of FIG. 6 shows the external surface of base plate 130 as viewed from the output side and having elongated emissive channels 132 and elongated exhaust channels 134. With reference to FIG. 4, the view of FIG. 6 is taken from the side that faces gas diffuser unit 140.

Figure 8A:
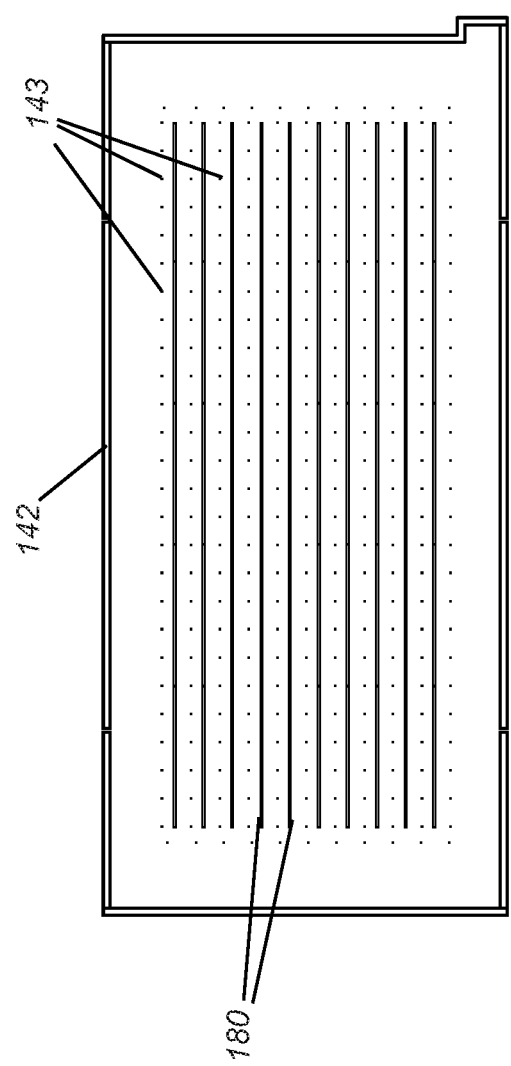
FIG. 8A is a plan view of a nozzle plate of the gas diffuser unit of FIG. 7.

The exploded view of FIG. 7 shows the basic arrangement of components used to form one embodiment of an optional gas diffuser unit 140, as used in the embodiment of FIG. 4 and in other embodiments as described subsequently. These include a nozzle plate 142, shown in the plan view of FIG. 8A. As shown in the views of FIGS. 6, 7, and 8A, nozzle plate 142 mounts against base plate 130 and obtains its gas flows from elongated emissive channels 132. In the embodiment shown, output passages 143 provide the needed gaseous materials. Sequential first exhaust slots 180 are provided in the exhaust path, as described subsequently.

A gas diffuser plate 146, which diffuses in cooperation with plates 142 and 148, shown in FIG. 8B, is mounted against nozzle plate 142. The arrangement of the various passages on nozzle plate 142, gas diffuser plate 146, and face plate 148 are optimized to provide the needed amount of diffusion for the gas flow and, at the same time, to efficiently direct exhaust gases away from the surface area of substrate 20. Slots 182 provide exhaust ports. In the embodiment shown, gas supply slots forming second diffuser output passages 147 and exhaust slots 182 alternate in gas diffuser plate 146.

Figure 8C:
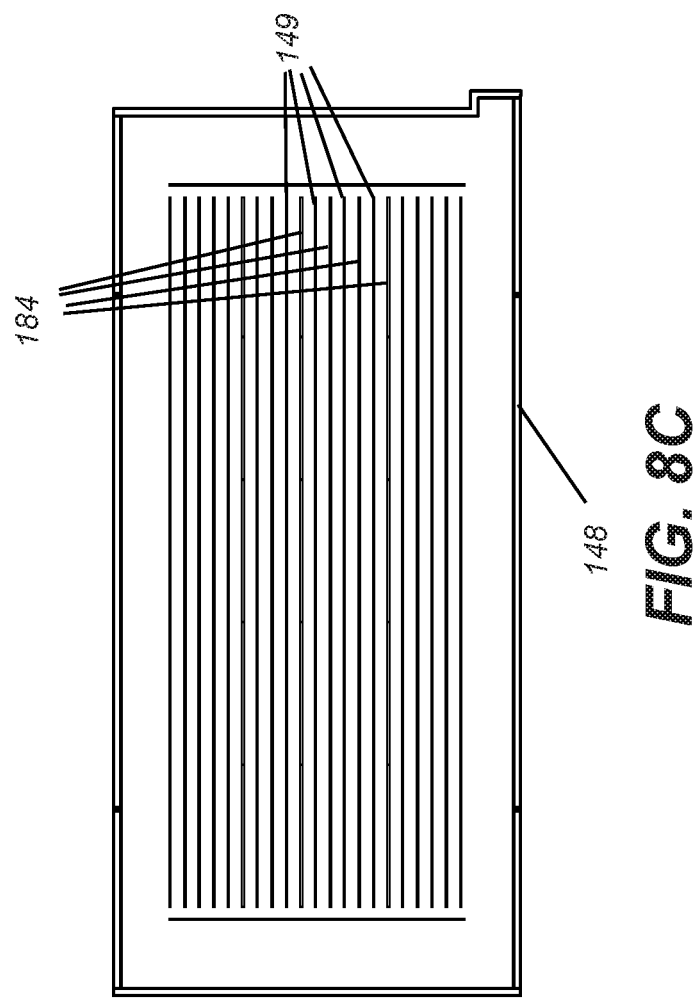
FIG. 8C is a plan view of a face plate of the gas diffuser unit of FIG. 7.

A face plate 148, as shown in FIG. 8C, then faces substrate 20. Third diffuser output passages 149 for providing gases and exhaust slots 184 again alternate with this embodiment.

Figure 8D:
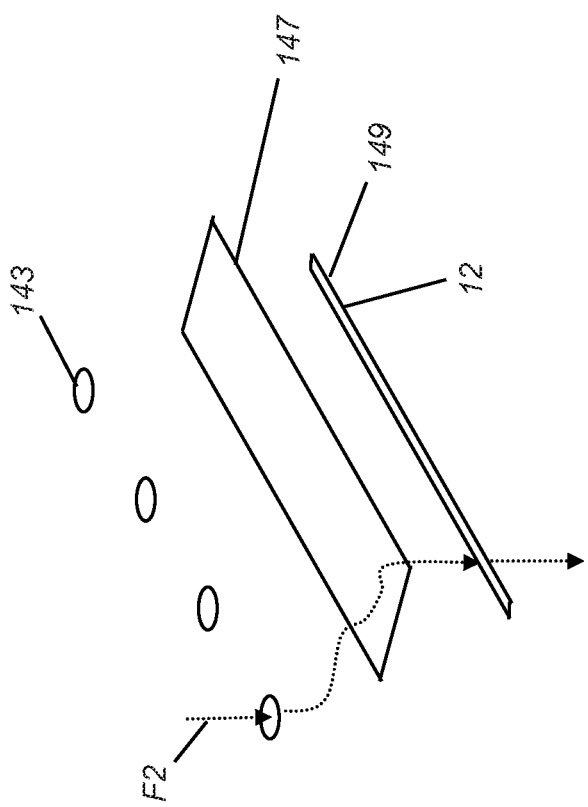
FIG. 8D is a perspective view of gas mixing within the gas diffuser unit of FIG. 7.
Figure 8E:
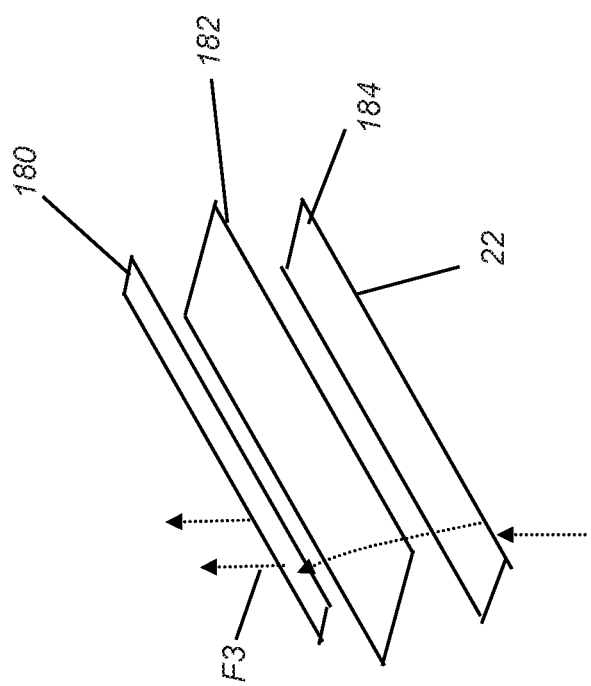
FIG. 8E is a perspective view of the gas ventilation path using the gas diffuser unit of FIG. 7.

FIG. 8D focuses on the gas delivery path through gas diffuser unit 140; FIG. 8E then shows the gas exhaust path in a corresponding manner. Referring to FIG. 8D there is shown, for a representative set of gas ports, the overall arrangement used for thorough diffusion of the reactant gas for an output flow F2 in one embodiment. The gas from base plate 130 (FIG. 4) is provided through first output passage 143 on nozzle plate 142. The gas goes downstream to a second diffuser output passage 147 on gas diffuser plate 146. As shown in FIG. 8D, there can be a vertical offset (that is, using the horizontal plate arrangement shown in FIG. 7, vertical being normal with respect to the plane of the horizontal plates) between passages 143 and 147 in one embodiment, helping to generate backpressure and thus facilitate a more uniform flow. The gas then goes further downstream to a third diffuser output passage 149 on face plate 148 to provide output channel 12. The different output passages 143, 147 and 149 may not only be spatially offset, but may also have different geometries to optimize mixing.

In the absence of the optional diffuser unit, the elongated emissive channels 132 in the base plate can serve as the output channels 12 for delivery head 10 instead of the third diffuser output passages 149.

FIG. 8E symbolically traces the exhaust path provided for venting gases in a similar embodiment, where the downstream direction is opposite that for supplied gases. A flow F3 indicates the path of vented gases through sequential third, second and first exhaust slots 184, 182, and 180, respectively. Unlike the more circuitous mixing path of flow F2 for gas supply, the venting arrangement shown in FIG. 8E is intended for the rapid movement of spent gases from the surface. Thus, flow F3 is relatively direct, venting gases away from the substrate surface.

Referring back to FIG. 4, the combination of components shown as connection plate 100, gas chamber plate 110, gas direction plate 120, and base plate 130 can be grouped to provide a delivery assembly 150. Alternate embodiments are possible for delivery assembly 150, including one formed from vertical, rather than horizontal, apertured plates, using the coordinate arrangement and view of FIG. 4.

Figure 9A:
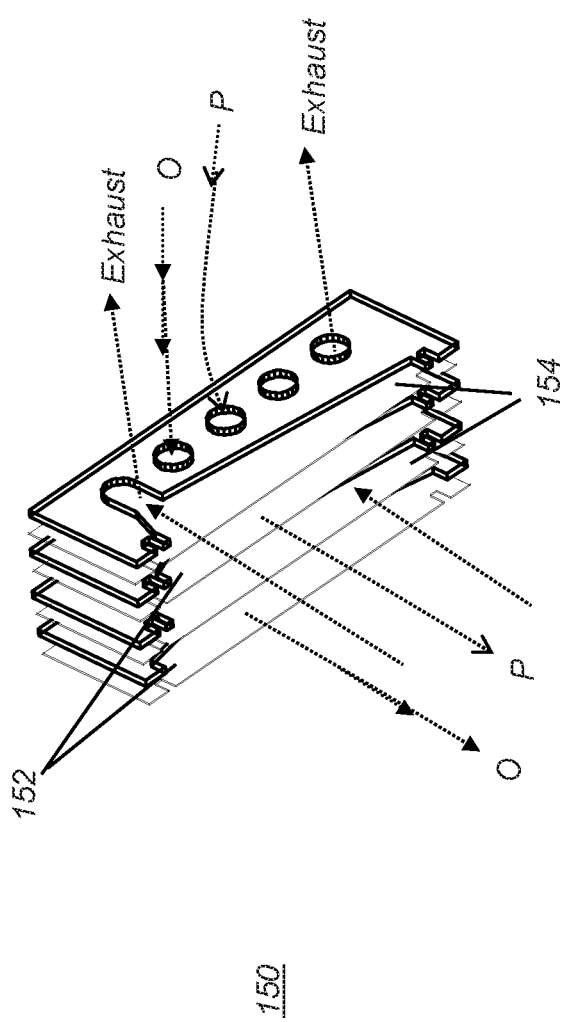
FIG. 9A is a perspective view of a portion of the delivery head in an embodiment using vertically stacked plates.

Referring to FIG. 9A, there is shown, from a bottom view (that is, viewed from the gas emission side) an alternate arrangement that can be used for delivery assembly 150 using a stack of superposed apertured plates that are disposed perpendicularly with respect to output face 36. For simplicity of explanation, the portion of delivery assembly 150 shown in the "vertical embodiment" of FIG. 9A has two elongated emissive channels 152 and two elongated exhaust channels 154. The vertical plates arrangement of FIGS. 9-A through 13C can be readily expanded to provide a number of emissive and exhaust channels. With apertured plates disposed perpendicularly with respect to the plane of output face 36, as in FIGS. 9A and 9B, each elongated emissive channel 152 is formed by having side walls defined by separator plates, shown subsequently in more detail, with a reactant plate centered between them. Proper alignment of apertures then provides fluid communication with the supply of gaseous material.

Figure 9B:
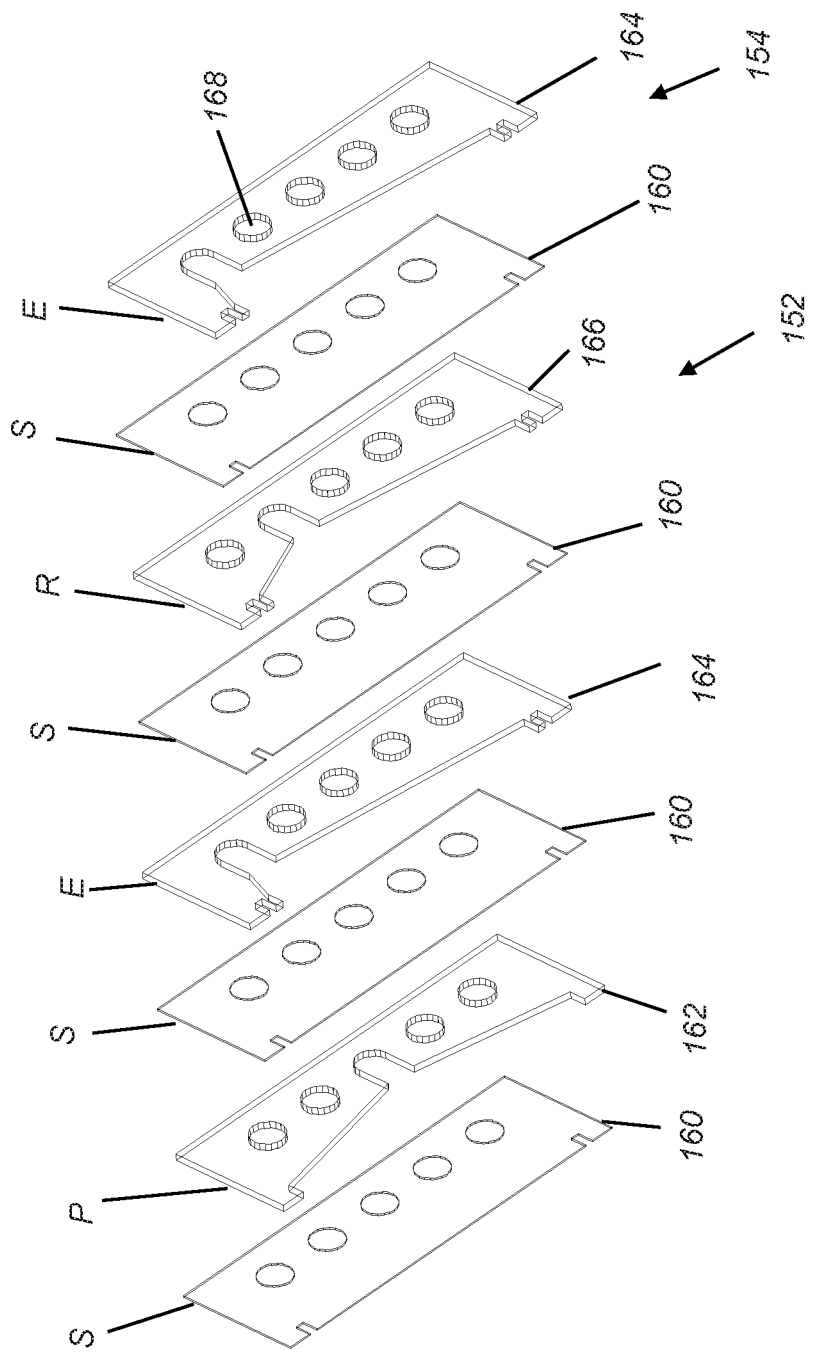
FIG. 9B is an exploded view of the components of the delivery head shown in FIG. 9A.
Figure 9C:
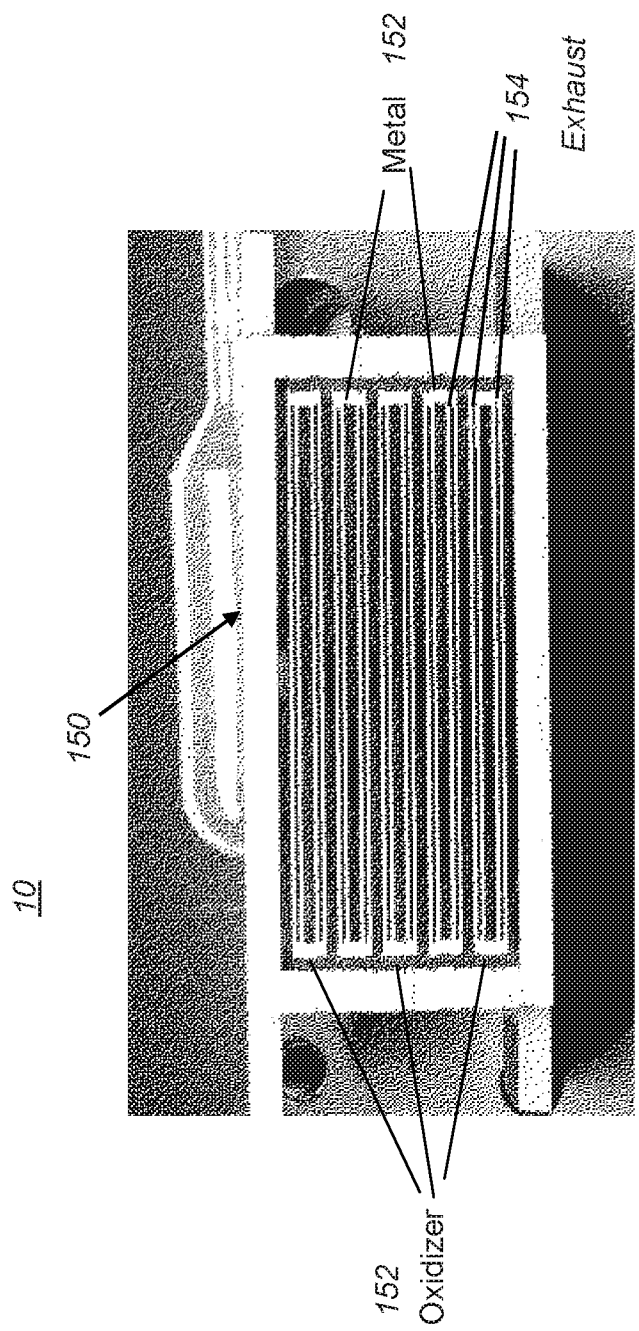
FIG. 9C is a plan view showing a delivery assembly formed using stacked plates.

The exploded view of FIG. 9B shows the arrangement of apertured plates used to form the small section of delivery assembly 150 that is shown in FIG. 9A. FIG. 9C is a plan view showing a delivery assembly 150 having five elongated channels for emitted gases and formed using stacked, apertured plates. FIGS. 10A through 13B then show the various apertured plates in both plan and perspective views. For simplicity, letter designations are given to each type of apertured plate: Separator S, Purge P, Reactant R, and Exhaust E.

Figure 12A:
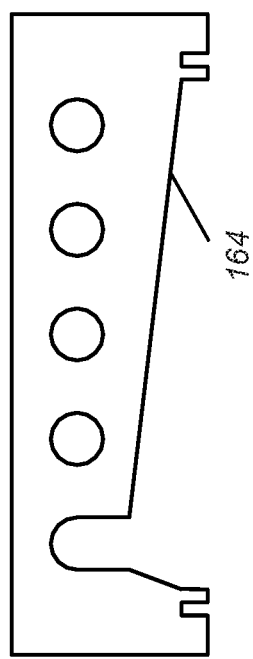
FIGS. 12A and 12B are plan and perspective views, respectively, of an exhaust plate used in the vertical plate embodiment of FIG. 9A.
Figure 12B:
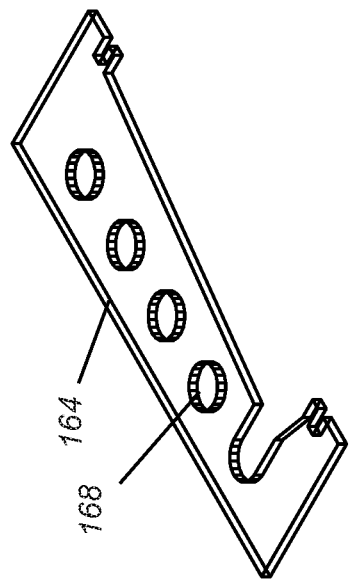
Figure 13A:
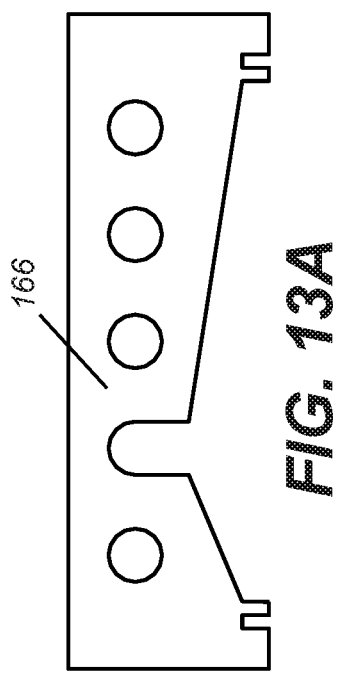
FIGS. 13A and 13B are plan and perspective views, respectively, of a reactant plate used in the vertical plate embodiment of FIG. 9A.
Figure 13B:
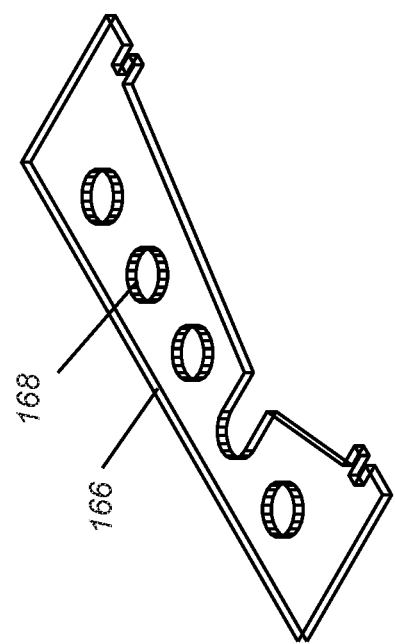

From left to right in FIG. 9B are separator plates 160 (S), also shown in FIGS. 10A and 10B, alternating between plates used for directing gas toward or away from the substrate. A purge plate 162 (P) is shown in FIGS. 11A and 11B. An exhaust plate 164 (E) is shown in FIGS. 12A and 12B. A reactant plate 166 (R) is shown in FIGS. 13A and 13B. FIG. 13C shows a reactant plate 166' obtained by flipping the reactant plate 166 of FIG. 12A horizontally; this alternate orientation can also be used with exhaust plate 164, as required. Apertures 168 in each of the apertured plates align when the plates are superposed, thus forming ducts to enable gas to be passed through delivery assembly 150 into elongated emissive output channels 152 and exhaust channels 154, as were described with reference to FIG. 1.

Returning to FIG. 9B, only a portion of a delivery assembly 150 is shown. The plate structure of this portion can be represented using the letter abbreviations assigned earlier, that is:

S-P-S-E-S-R-S-E-(S)

(With the last separator plate in this sequence not shown in FIG. 9A or 9B.) As this sequence shows, separator plates 160 (S) define each channel by forming side walls. A minimal delivery assembly 150 for providing two reactive gases along with the necessary purge gases and exhaust channels for typical ALD deposition would be represented using the full abbreviation sequence:

S-P-S-E1-S-R1-S-E1-S-P-S-E2-S-R2-S-E2-S-P-S-E1-
S-R1-S-E1-S-P-S-E2-S-R2-S-E2-S-P-S-E1-S-
R1-S-E1-S-P-S where R1 and R2 represent reactant plates 166 in different orientations, for the two different reactant gases used, and E1 and E2 correspondingly represent exhaust plates 164 in different orientations.

Exhaust channel 154 need not be a vacuum port, in the conventional sense, but may simply be provided to draw off the flow from its corresponding output channel 12, thus facilitating a uniform flow pattern within the channel. A negative draw, just slightly less than the opposite of the gas pressure at neighboring elongated emissive channels 152, can help to facilitate an orderly flow. The negative draw can, for example, operate with draw pressure at the source (for example, a vacuum pump) of between 0.2 and 1.0 atmosphere, whereas a typical vacuum is, for example, below 0.1 atmosphere.

Use of the flow pattern provided by delivery head 10 provides a number of advantages over conventional approaches, such as those noted earlier in the background section, that pulse gases individually to a deposition chamber. Mobility of the deposition apparatus improves, and the device of the present invention is suited to high-volume deposition applications in which the substrate dimensions exceed the size of the deposition head. Flow dynamics are also improved over earlier approaches.

The flow arrangement used in the present invention allows a very small distance D between delivery head 10 and substrate 20, as was shown in FIG. 1, preferably under 1 mm. Output face 36 can be positioned very closely, to within about 1 mil (approximately 0.025 mm) of the substrate surface. The close positioning is facilitated by the gas pressure generated by the reactant gas flows. By comparison, CVD apparatus require significantly larger separation distances. Earlier approaches such as the cyclical deposition described in the U.S. Pat. No. 6,821,563 to Yudovsky, cited earlier, were limited to 0.5 mm or greater distance to the substrate surface, whereas embodiments of the present invention can be practiced at less than 0.5 mm, for example, less than 0.450 mm. In fact, positioning the delivery head 10 closer to the substrate surface is preferred in the present invention. In a particularly preferred embodiment, distance D from the surface of the substrate can be 0.20 mm or less, preferably less than 100 µm.

It is desirable that when a large number of plates are assembled in a stacked-plate embodiment, the gas flow delivered to the substrate is uniform across all of the channels delivering a gas flow (I, M, or O channels). This can be accomplished by proper design of the apertured plates, such as having restrictions in some part of the flow pattern for each plate which are accurately machined to provide a reproducible pressure drop for each emissive output or exhaust channel. In one embodiment, output channels 12 exhibit substantially equivalent pressure along the length of the openings, to within no more than about 10% deviation. Even higher tolerances could be provided, such as allowing no more than about 5% or even as little as 2% deviation.

Although the method using stacked apertured plates is a particularly useful way of constructing the article of this invention, there are a number of other methods for building such structures that may be useful in alternate embodiments. For example, the apparatus may be constructed by direct machining of a metal block, or of several metal blocks adhered together. Furthermore, molding techniques involving internal mold features can be employed, as will be understood by the skilled artisan. The apparatus can also be constructed using any of a number of stereolithography techniques.

One advantage offered by delivery head 10 of the present invention relates to maintaining a suitable separation distance D (FIG. 1) between its output face 36 and the surface of substrate 20. FIG. 14 shows some key considerations for maintaining distance D using the pressure of gas flows emitted from delivery head 10.

In FIG. 14, a representative number of output channels 12 and exhaust channels 22 are shown. The pressure of emitted gas from one or more of output channels 12 generates a force, as indicated by the downward arrow in this figure. In order for this force to provide a useful cushioning or "air" bearing (gas fluid bearing) effect for delivery head 10, there must be sufficient landing area, that is, solid surface area along output face 36 that can be brought into close contact with the substrate. The percentage of landing area corresponds to the relative amount of solid area of output face 36 that allows build-up of gas pressure beneath it. In simplest terms, the landing area can be computed as the total area of output face 36 minus the total surface area of output channels 12 and exhaust channels 22. This means that total surface area, excluding the gas flow areas of output channels 12, having a width w1, or of exhaust channels 22, having a width w2, must be maximized as much as possible. A landing area of 95% is provided in one embodiment. Other embodiments may use smaller landing area values, such as 85% or 75%, for example. Adjustment of gas flow rate could also be used in order to alter the separation or cushioning force and thus change distance D accordingly.

It can be appreciated that there would be advantages to providing a gas fluid bearing, so that delivery head 10 is substantially maintained at a distance D above substrate 20. This would allow essentially frictionless motion of delivery head 10 using any suitable type of transport mechanism. Delivery head 10 could then be caused to "hover" above the surface of substrate 20 as it is channeled back and forth, sweeping across the surface of substrate 20 during materials deposition.

As shown in FIG. 14, delivery head 10 may be too heavy, so that the downward gas force is not sufficient for maintaining the needed separation. In such a case, auxiliary lifting components, such as a spring 170, magnet, or other device, could be used to supplement the lifting force. In other cases, gas flow may be high enough to cause the opposite problem, so that delivery head 10 would be forced apart from the surface of substrate 20 by too great a distance, unless additional force is exerted. In such a case, spring 170 may be a compression spring, to provide the additional needed force to maintain distance D (downward with respect to the arrangement of FIG. 14). Alternately, spring 170 may be a magnet, elastomeric spring, or some other device that supplements the downward force.

Figure 20:
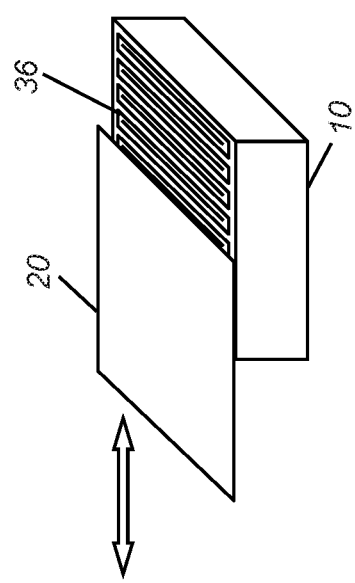
FIG. 20 is a perspective view of an embodiment using a gas cushion to separate the delivery head from the substrate.

Alternately, delivery head 10 may be positioned in some other orientation with respect to substrate 20. For example, substrate 20 could be supported by the air bearing effect, opposing gravity, so that substrate 20 can be moved along delivery head 10 during deposition. One embodiment using the air bearing effect for deposition onto substrate 20, with substrate 20 cushioned above delivery head 10 is shown in FIG. 20. Movement of substrate 20 across output face 36 of delivery head 10 is in a direction along the double arrow as shown.

The alternate embodiment of FIG. 21 shows substrate 20 on a substrate support 74, such as a web support or rollers, moving in direction K between delivery head 10 and a gas fluid bearing 98. In this embodiment, delivery head 10 has an air-bearing or, more appropriately, a gas fluid-bearing effect and cooperates with gas fluid bearing 98 in order to maintain the desired distance D between output face 36 and substrate 20. Gas fluid bearing 98 may direct pressure using a flow F4 of inert gas, or air, or some other gaseous material. It is noted that, in the present deposition system, a substrate support or holder can be in contact with the substrate during deposition, which substrate support can be a means for conveying the substrate, for example a roller. Thus, thermal isolation of the substrate being treated is not a requirement of the present system.

As was particularly described with reference to FIGS. 3A and 3B, delivery head 10 requires movement relative to the surface of substrate 20 in order to perform its deposition function. This relative movement can be obtained in a number of ways, including movement of either or both delivery head 10 and substrate 20, such as by movement of an apparatus that provides a substrate support. Movement can be oscillating or reciprocating or could be continuous movement, depending on how many deposition cycles are needed. Rotation of a substrate can also be used, particularly in a batch process, although continuous processes are preferred. An actuator may be coupled to the body of the delivery head, such as mechanically connected. An alternating force, such as a changing magnetic force field, could alternately be used.

Typically, ALD requires multiple deposition cycles, building up a controlled film depth with each cycle. Using the nomenclature for types of gaseous materials given earlier, a single cycle can, for example in a simple design, provide one application of first reactant gaseous material O and one application of second reactant gaseous material M.

The distance between output channels for O and M reactant gaseous materials determines the needed distance for reciprocating movement to complete each cycle. For the example delivery head 10 of FIG. 4 may have a nominal channel width of 0.1 inches (2.54 mm) in width between a reactant gas channel outlet and the adjacent purge channel outlet. Therefore, for the reciprocating motion (along the y axis as used herein) to allow all areas of the same surface to see a full ALD cycle, a stroke of at least 0.4 inches (10.2 mm) would be required. For this example, an area of substrate 20 would be exposed to both first reactant gaseous material O and second reactant gaseous material M with movement over this distance. Alternatively, a delivery head can move much larger distances for its stroke, even moving from one end of a substrate to another. In this case the growing film may be exposed to ambient conditions during periods of its growth, causing no ill effects in many circumstances of use. In some cases, consideration for uniformity may require a measure of randomness to the amount of reciprocating motion in each cycle, such as to reduce edge effects or build-up along the extremes of reciprocation travel.

A delivery head 10 may have only enough output channels 12 to provide a single cycle. Alternately, delivery head 10 may have an arrangement of multiple cycles, enabling it to cover a larger deposition area or enabling its reciprocating motion over a distance that allows two or more deposition cycles in one traversal of the reciprocating motion distance.

For example, in one particular application, it was found that each O-M cycle formed a layer of one atomic diameter over about ¼ of the treated surface. Thus, four cycles, in this case, are needed to form a uniform layer of 1 atomic diameter over the treated surface. Similarly, to form a uniform layer of 10 atomic diameters in this case, then, 40 cycles would be required.

Figure 15:
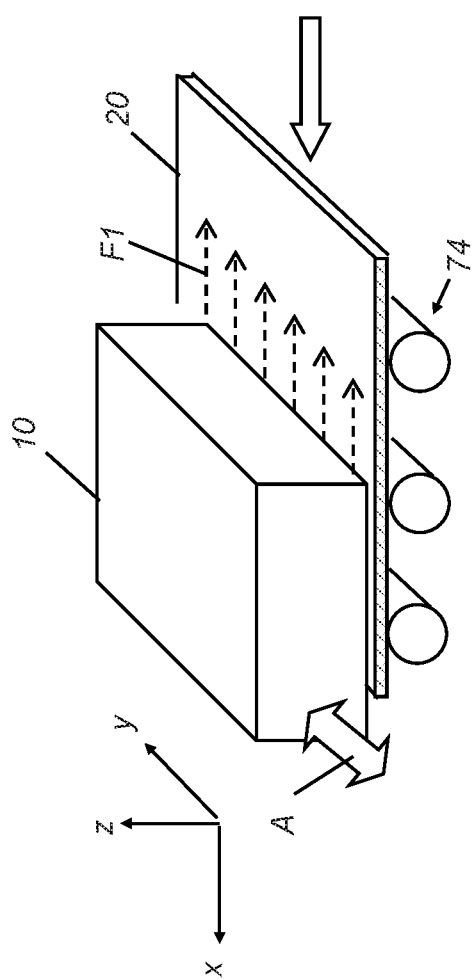
FIG. 15 is a perspective view showing a distribution head used with a substrate transport system.

An advantage of the reciprocating motion used for a delivery head 10 of the present invention is that it allows deposition onto a substrate 20 whose area exceeds the area of output face 36. FIG. 15 shows schematically how this broader area coverage can be effected, using reciprocating motion along the y axis as shown by arrow A and also movement orthogonal or transverse to the reciprocating motion, relative to the x axis. Again, it must be emphasized that motion in either the x or y direction, as shown in FIG. 15, can be effected either by movement of delivery head 10, or by movement of substrate 20 provided with a substrate support 74 that provides movement, or by movement of both delivery head 10 and substrate 20.

In FIG. 15 the relative motion directions of the delivery head and the substrate are perpendicular to each other. It is also possible to have this relative motion in parallel. In this case, the relative motion needs to have a nonzero frequency component that represents the oscillation and a zero frequency component that represents the displacement of the substrate. This combination can be achieved by: an oscillation combined with displacement of the delivery head over a fixed substrate; an oscillation combined with displacement of the substrate relative to a fixed substrate delivery head; or any combinations wherein the oscillation and fixed motion are provided by movements of both the delivery head and the substrate.

Advantageously, delivery head 10 can be fabricated at a smaller size than is possible for many types of deposition heads. For example, in one embodiment, output channel 12 has width w1 of about 0.005 inches (0.127 mm) and is extended in length to about 3 inches (75 mm).

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining good performance when using preferred embodiments of the apparatus of the present invention.

Figure 16:
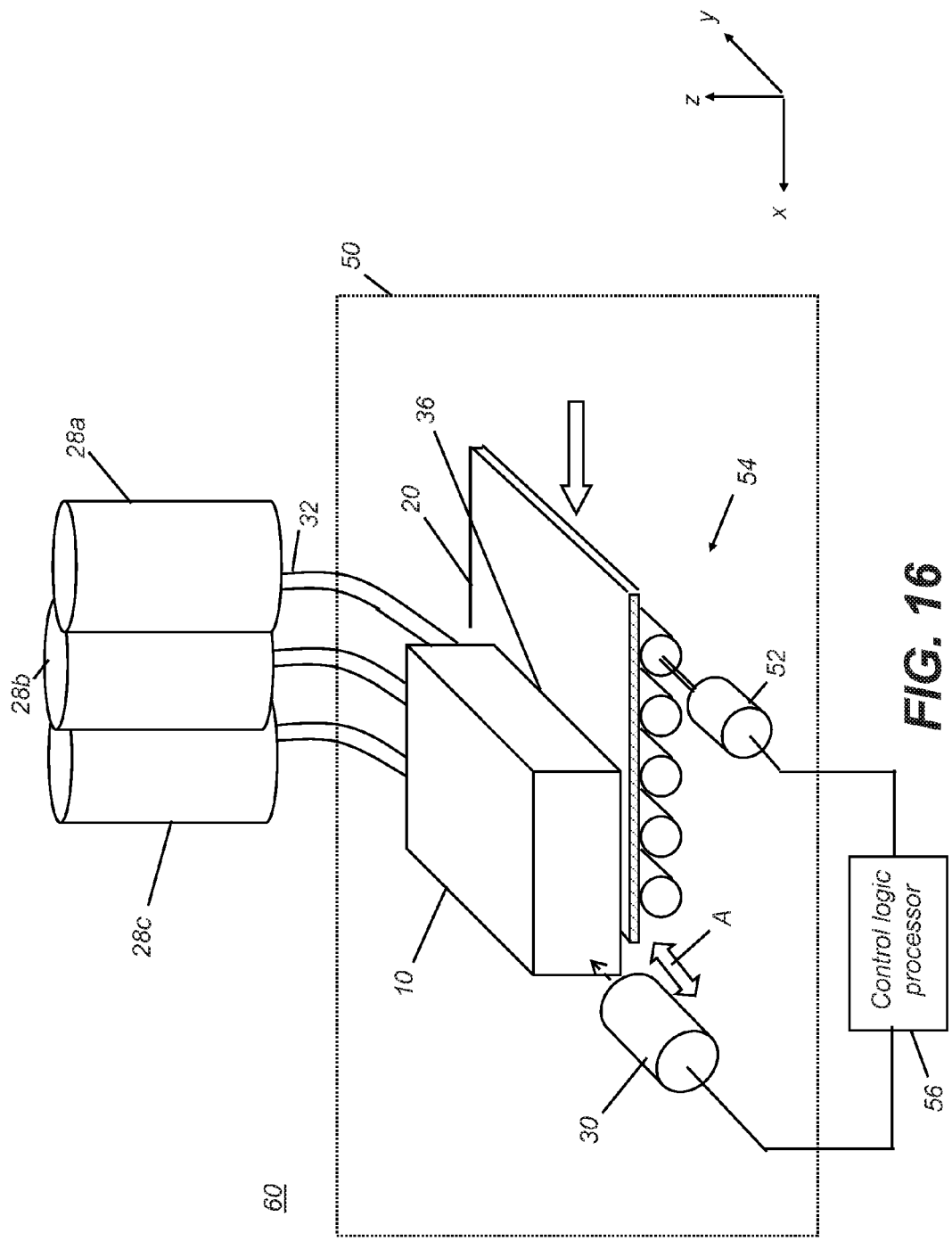
FIG. 16 is a perspective view showing a deposition system using the delivery head of the present invention.

FIG. 16 shows an Atomic Layer Deposition (ALD) system 60 having a chamber 50 for providing a relatively well-controlled and contaminant-free environment. Gas supplies 28a, 28b, and 28c provide the first, second, and third gaseous materials to delivery head 10 through supply lines 32. The optional use of flexible supply lines 32 facilitates ease of movement of delivery head 10. For simplicity, optional vacuum vapor recovery apparatus and other support components are not shown in FIG. 16, but could also be used. A transport subsystem 54 provides a substrate support that conveys substrate 20 along output face 36 of delivery head 10, providing movement in the x direction, using the coordinate axis system employed in the present disclosure. Motion control, as well as overall control of valves and other supporting components, can be provided by a control logic processor 56, such as a computer or dedicated microprocessor assembly, for example. In the arrangement of FIG. 16, control logic processor 56 controls an actuator 30 for providing reciprocating motion to delivery head 10 and also controls a transport motor 52 of transport subsystem 54. Actuator 30 can be any of a number of devices suitable for causing back-and-forth motion of delivery head 10 along a moving substrate 20 (or, alternately, along a stationary substrate 20).

Figure 17:
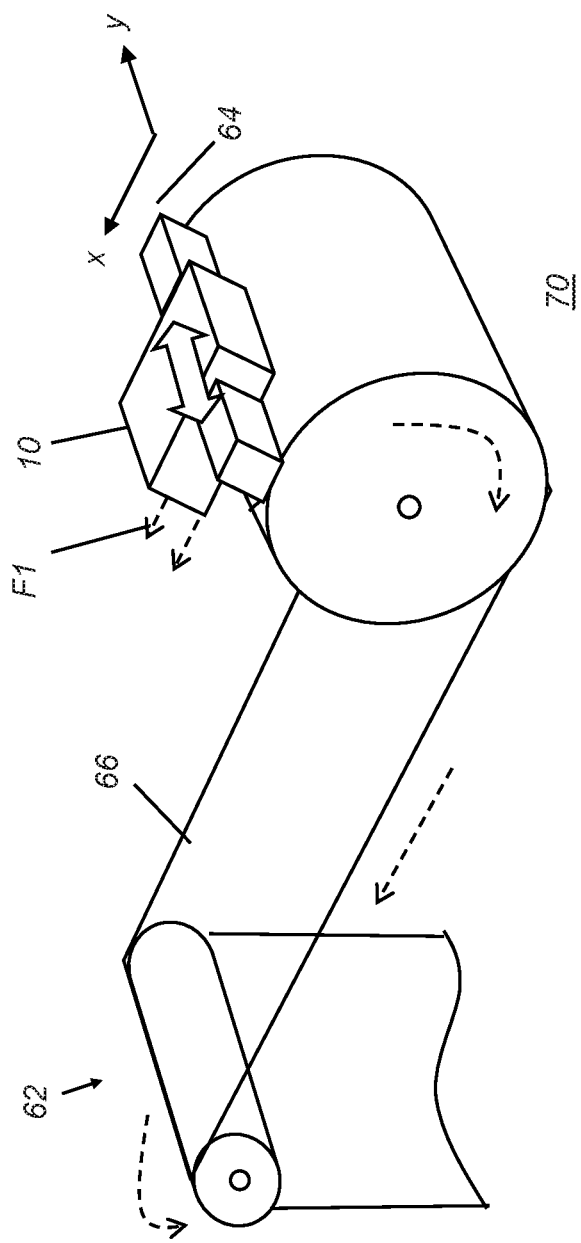
FIG. 17 is a perspective view showing one embodiment of a deposition system applied to a moving web.

FIG. 17 shows an alternate embodiment of an Atomic Layer Deposition (ALD) system 70 for thin film deposition onto a web substrate 66 that is conveyed past delivery head 10 along a web conveyor 62 that acts as a substrate support. The web itself may be the substrate or may provide support for an additional substrate. A delivery head transport 64 conveys delivery head 10 across the surface of web substrate 66 in a direction transverse to the web travel direction. In one embodiment, delivery head 10 is impelled back and forth across the surface of web substrate 66, with the full separation force provided by gas pressure. In another embodiment, delivery head transport 64 uses a lead screw or similar mechanism that traverses the width of web substrate 66. In another embodiment, multiple delivery heads 10 are used, at suitable positions along web 62.

Figure 18:
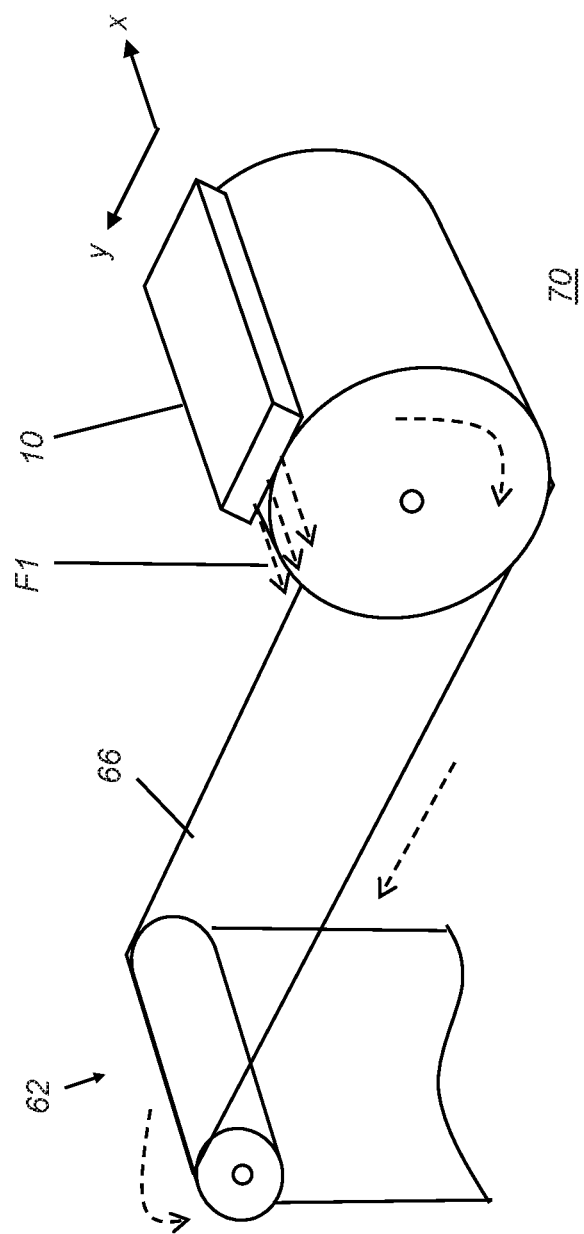
FIG. 18 is a perspective view showing another embodiment of deposition system applied to a moving web.
Figure 19:
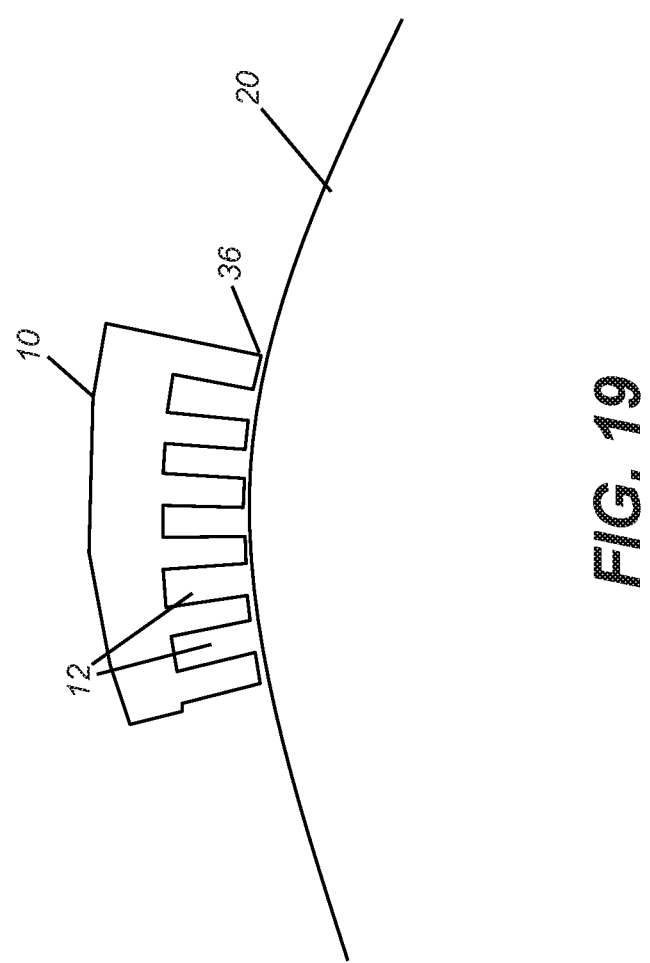
FIG. 19 is a cross-sectional side view of one embodiment of a delivery head with an output face having curvature.

FIG. 18 shows another Atomic Layer Deposition (ALD) system 70 in a web arrangement, using a stationary delivery head 10 in which the flow patterns are oriented orthogonally to the configuration of FIG. 17. In this arrangement, motion of web conveyor 62 itself provides the movement needed for ALD deposition. Reciprocating motion could also be used in this environment. Referring to FIG. 19, an embodiment of a portion of delivery head 10 is shown in which output face 36 has an amount of curvature, which might be advantageous for some web coating applications. Convex or concave curvature could be provided.

In another embodiment that can be particularly useful for web fabrication, ALD system 70 can have multiple delivery heads 10, or dual delivery heads 10, with one disposed on each side of substrate 66. A flexible delivery head 10 could alternately be provided. This would provide a deposition apparatus that exhibits at least some conformance to the deposition surface.

In another embodiment, one or more output channels 12 of delivery head 10 may use the transverse gas flow arrangement that was disclosed in U.S. Pat. No. 7,456,429 (Levy et al.), hereby incorporated herein by reference. In such an embodiment, gas pressure that supports separation between delivery head 10 and substrate 20 can be maintained by some number of output channels 12, such as by those channels that emit purge gas (channels labeled I in FIGS. 2-3B), for example. Transverse flow would then be used for one or more output channels 12 that emit the reactant gases (channels labeled O or M in FIGS. 2-3B).

The apparatus of the present invention is advantaged in its capability to perform deposition onto a substrate over a broad range of temperatures, including room or near-room temperature in some embodiments. The apparatus of the present invention can operate in a vacuum environment, but is particularly well suited for operation at or near atmospheric pressure.

Thin film transistors having a semiconductor film made according to the present method can exhibit a field effect electron mobility that is greater than 0.01 cm$^2$/Vs, preferably at least 0.1 cm$^2$/Vs, more preferably greater than 0.2 cm$^2$/Vs. In addition, n-channel thin film transistors having semiconductor films made according to the present invention are capable of providing on/off ratios of at least $10^4$, advantageously at least $10^5$. The on/off ratio is measured as the maximum/minimum of the drain current as the gate voltage is swept from one value to another that are representative of relevant voltages which might be used on the gate line of a display. A typical set of values would be −10V to 40V with the drain voltage maintained at 30V.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, while air bearing effects may be used to at least partially separate delivery head 10 from the surface of substrate 20, the apparatus of the present invention may alternately be used to lift or levitate substrate 20 from output surface 36 of delivery head 10. Other types of substrate holder could alternately be used, including a platen for example.

EXAMPLES

Comparative Example C1

For comparison to the present invention, a film of $Al_2O_3$ was grown on a silicon wafer using a control APALD (Atmospheric Pressure Atomic Layer deposition) as disclosed in U.S. Pat. No. 7,456,429 (Levy et al.). The APALD device was configured to have 11 output channels in a configuration as follows:

Channel 1: Purge Gas
Channel 2: Oxidizer containing gas
Channel 3: Purge Gas
Channel 4: Metal precursor containing gas
Channel 5: Purge Gas
Channel 6: Oxidizer containing gas
Channel 7: Purge Gas
Channel 8: Metal precursor containing gas
Channel 9: Purge Gas Channel 10: Oxidizer containing gas
Channel 11: Purge Gas The film was grown at a substrate temperature of 150° C. Gas flows delivered to the APALD coating head were as follows:

(i) A nitrogen inert purge gas was supplied to channels 1, 3, 5, 7, 9, 11 at a total flow rate of 2000 sccm (standard cubic centimeters per minute).

(ii) A nitrogen based gas stream containing trimethylaluminum (TMA) was supplied to channels 4 and 8. This gas stream was produced by mixing a flow of 300 sccm of pure nitrogen with a flow of 7 sccm of nitrogen saturated with TMA at room temperature.

(iii) A nitrogen based gas stream containing water vapor was supplied to channels 2, 6, and 10. This gas stream was produced by mixing a flow of 300 sccm of pure nitrogen with a flow of 25 sccm of nitrogen saturated with water vapor at room temperature.

The coating head with the above gas supply streams was brought to a fixed position of approximately 30 micrometers above the substrate, using a micrometer adjustment mechanism. At this point, the coating head was oscillated for 175 cycles across the substrate to yield an $Al_2O_3$ film of approximately 900 Å thickness.

A current leakage test structure was formed by coating aluminum contacts on top of the $Al_2O_3$ layer using a shadow mask during an aluminum evaporation. This process resulted in aluminum contact pads on top of the $Al_2O_3$ that were approximately 500 Å thick with an area of 500 microns×200 microns.

The leakage current from the silicon wafer to the Al contacts was measured by applying a 20V potential between a given aluminum contact pad to the silicon wafer and measuring the amount the current flow with an HP-4155C® parameter analyzer.

For this sample at a 20 V potential, the leakage current was $8.2 \times 10^{-8}$ A.

Example E1

A film of $Al_2O_3$ was grown on a silicon wafer using the APALD device of the present invention. The APALD device was configured analogously to the device of comparative example C1. The film was grown at a substrate temperature of 150° C. Gas flows delivered to the APALD coating head were as follows:

(i) A nitrogen inert purge gas was supplied to channels 1, 3, 5, 7, 9, and 11 at a total flow rate of 3000 sccm.

(ii) A nitrogen based gas stream containing trimethylaluminum was supplied to channels 4 and 8. This gas stream was produced by mixing a flow of ~400 sccm of pure nitrogen with a flow of 3.5 sccm of nitrogen saturated with TMA at room temperature.

(iii) A nitrogen based gas stream containing water vapor was supplied to channels 2, 6, and 10. This gas stream was produced by mixing a flow of ~350 sccm of pure nitrogen with a flow of 20 sccm of nitrogen saturated with water vapor at room temperature.

The coating head with the above gas supply streams was brought into proximity with the substrate and then released, so that it floated above the substrate based upon the gas flows as described earlier. At this point, the coating head was oscillated for 300 cycles across the substrate to yield an $Al_2O_3$ film of approximately 900 Å thickness.

A current leakage test structure was formed by coating aluminum contact pads on top of the $Al_2O_3$ layer with the same procedure and contact pad size as in example C1.

At a 20 V potential, the leakage through the $Al_2O_3$ dielectric was $1.3 \times 10^{-11}$ A. As can be seen from this test data, the gas elevation coating head of this example produces a film with significantly lower current leakage, which is desired for the production of useful dielectric films.

PARTS LIST 10 delivery head
12 output channel
14, 16, 18 gas inlet conduit
20 substrate
22 exhaust channel
24 exhaust conduit
28a, 28b, 28c gas supply
30 actuator
32 supply line
36 output face
50 chamber
52 transport motor
54 transport subsystem
56 control logic processor
60 Atomic Layer Deposition (ALD) system
62 web conveyor
64 delivery head transport
66 web substrate
70 Atomic Layer Deposition (ALD) system
74 substrate support
90 directing channel for precursor material
91 exhaust directing channel
92 directing channel for purge gas
96 substrate support
98 gas fluid bearing
100 connection plate
102 directing chamber
104 input port
110 gas chamber plate
112, 113, 115 supply chamber
114, 116 exhaust chamber
120 gas direction plate
122 directing channel for precursor material
123 exhaust directing channel
130 base plate
132 elongated emissive channel
134 elongated exhaust channel
140 gas diffuser unit
142 nozzle plate
143, 147, 149 first, second, third diffuser output passage
146 gas diffuser plate
148 face plate
150 delivery assembly
152 elongated emissive channel
154 elongated exhaust channel
160 separator plate
162 purge plate
164 exhaust plate
166, 166' reactant plate
168 aperture
170 spring
180 sequential first exhaust slot
182 sequential second exhaust slot
184 sequential third exhaust slot
A arrow
D distance
E exhaust plate
F1, F2, F3, F4 gas flow
H height I third inert gaseous material
K direction
M second reactant gaseous material
O first reactant gaseous material
P purge plate
R reactant plate
S separator plate
w1, w2 channel width
X arrow

The invention claimed is:

1. A process for depositing a thin film material on a substrate, comprising:
providing a substrate having a surface into a thin film deposition system, the thin film deposition system having a delivery head with an associated output face for providing a series of gas flows, wherein a separation distance between the output face and the surface of the substrate is adjustable by adjusting one or more of the gas flows;
simultaneously directing the series of gas flows from the output face of the delivery head during thin film deposition system toward the surface of a substrate, the series of gas flows comprising at least a first reactive gaseous material, an inert purge gas, and a second reactive gaseous material, wherein the first reactive gaseous material is capable of reacting with a substrate surface treated with the second reactive gaseous material;
providing relative motion between the delivery head and the substrate such that the surface of the substrate is exposed to the first reactive gaseous material, the inert purge gas and the second reactive gaseous material for thin film deposition; and
maintaining a substantially uniform separation distance between the output face of the delivery head and the surface of the substrate during thin film deposition using a pressure provided by one or more of the gas flows.

2. The process of claim 1 wherein the gas flows are provided from a series of open elongated output channels, substantially in parallel, wherein the output face of the delivery head is spaced within 1 mm of the surface of the substrate subject to deposition.

3. The process of claim 1 wherein the substrate is treated by a plurality of delivery heads spaced apart.

4. The process of claim 1 wherein a given area of the substrate is exposed to the gas flow of the first reactive gaseous material for less than about 500 milliseconds at a time.

5. The process of claim 1 wherein the gas flow of at least one of the reactive gases is at least 1 sccm.

6. The process of claim 1 wherein the temperature of the substrate during deposition is under 300° C.

7. The process of claim 1 wherein the first reactive gaseous material is a metal-containing compound and the second reactive gaseous material is a non-metallic compound.

8. The process of claim 7 wherein the metal is an element of Group II, III, IV, V, or VI of the Periodic Table.

9. The process of claim 7 wherein the metal-containing compound is an organometallic compound that can be vaporized at a temperature under 300° C.

10. The process of claim 7 wherein the metal-containing reactive gaseous material reacts with the non-metallic reactive gaseous material to form an oxide or sulfide material selected from the group consisting of tantalum pentoxide, aluminum oxide, titanium oxide, niobium pentoxide, zirconium oxide, hafnium oxide, zinc oxide, lanthium oxide, yttrium oxide, cerium oxide, vanadium oxide, molybdenum oxide, manganese oxide, tin oxide, indium oxide, tungsten oxide, silicon dioxide, zinc sulfide, strontium sulfide, calcium sulfide, lead sulfide, and mixtures thereof.

11. The process of claim 1 wherein the process is used to make a semiconductor or dielectric thin film on a substrate, for use in a transistor, wherein the thin film comprises a metal-oxide-based material, the process comprising forming on a substrate, at a temperature of 300° C. or less, at least one layer of a metal-oxide-based material, wherein the metal-oxide-based material is a reaction product of at least two reactive gases, a first reactive gas comprising an organometallic precursor compound and a second reactive gas comprising a reactive oxygen-containing gaseous material.

12. The process of claim 1 wherein a surface of the substrate is placed at a distance of under 1 mm from the output face of the delivery head.

13. The process of claim 12 wherein the distance is less than 0.5 mm.

14. The process of claim 1 wherein the relative motion between the delivery head and the substrate is provided by a substrate support or an actuator attached to the delivery head, or both.

15. The process of claim 1, wherein the step of providing the relative motion between the delivery head and the substrate by further comprises providing the delivery head with an oscillating motion, optionally an oscillating motion that is orthogonal to the length direction of an output channel of the delivery head.

16. The process of claim 1 further comprising moving the substrate along the output face of the delivery head, optionally continuously in one direction.

17. The process of claim 1 wherein the surface area of the substrate for thin-film material deposition exceeds the surface area of the output face of the delivery head.

18. The process of claim 1 wherein the substrate is at a separation distance of within 0.3 mm of the output face of the delivery head.

19. The process of claim 1 wherein the flow of gaseous material in a first, a second, and a third output channel is substantially continuous during the deposition operation.

20. The process of claim 1 wherein the substrate and the delivery head are open to the atmosphere.

21. The process of claim 1 for thin film deposition onto a substrate further comprising a conveyer for moving a web past the output face of the delivery head to effect thin film deposition over an area of the substrate, wherein the web either supports an additional substrate or is the substrate for the thin film deposition, wherein the substrate is in close proximity to the output face of the delivery head and wherein, during operation of the process, the conveyer for the web or an actuator for the delivery head, or both, is capable of providing relative movement between the output face and the substrate while maintaining close proximity.

22. The process of claim 1, further comprising providing an air bearing between the delivery head and the substrate, wherein the pressure contributes to at least a portion of said air bearing.

* * * * *